United States Patent
Binal

(10) Patent No.: US 12,368,422 B2
(45) Date of Patent: Jul. 22, 2025

(54) AUDIO SYSTEM EQUALIZATION BASED ON TYPE OF AUDIO BEING BROADCAST

(71) Applicant: Crestron Electronics, Inc., Rockleigh, NJ (US)

(72) Inventor: Ekin Binal, Brooklyn, NY (US)

(73) Assignee: Crestron Electronics, Inc., Rockleigh, NJ (US)

( * ) Notice: Subject to any disclaimer, the term of this patent is extended or adjusted under 35 U.S.C. 154(b) by 308 days.

(21) Appl. No.: 17/989,427

(22) Filed: Nov. 17, 2022

(65) Prior Publication Data

US 2023/0163742 A1  May 25, 2023

Related U.S. Application Data

(60) Provisional application No. 63/282,320, filed on Nov. 23, 2021.

(51) Int. Cl.
*H04R 3/04* (2006.01)
*G06F 3/16* (2006.01)
*G10L 15/26* (2006.01)
*G10L 25/30* (2013.01)
*G10L 25/87* (2013.01)
(Continued)

(52) U.S. Cl.
CPC ............ *H03G 5/165* (2013.01); *G06F 3/162* (2013.01); *G06F 3/165* (2013.01); *G10L 15/26* (2013.01); *G10L 25/30* (2013.01); *G10L 25/87* (2013.01); *H03F 3/72* (2013.01); *H03K 5/1532* (2013.01); *H03M 1/1071* (2013.01); *H04L 12/10* (2013.01); *H04L 67/06* (2013.01); *H04L 67/34* (2013.01); *H04R 1/00* (2013.01); *H04R 3/04* (2013.01); *H04R 5/04* (2013.01); *H04R 29/001* (2013.01);
(Continued)

(58) Field of Classification Search
None
See application file for complete search history.

(56) References Cited

U.S. PATENT DOCUMENTS 9,390,719 B1 * 7/2016 Roblek ................ G10L 19/025
2006/0193477 A1 * 8/2006 Zehnle .................... H03G 5/005
381/94.2

* cited by examiner

*Primary Examiner* — James K Mooney
(74) *Attorney, Agent, or Firm* — Mark W. Hrozenchik

(57) ABSTRACT

Disclosed herein is a system and method for optimizing audio equalization settings based on the type of music being broadcast, comprising: receiving audio at a processing device; performing a frequency analysis of the received audio, to determine a plurality of frequency components and associated amplitudes of the frequency components of the received audio; generating a spectral plot of the received audio based on the performed frequency analysis of the received audio, wherein the spectral plot comprises an x axis that represents relative amplitude and a y axis that represents frequency components of the received audio; comparing the spectral plot of the received audio to each of a plurality of different predetermined spectral plots; matching the spectral plot of the received audio to at least one of a plurality of different predetermined spectral plots; retrieving a predetermined equalizer settings file that corresponds to the at least one of the matched predetermined spectral plots, wherein the predetermined equalizer settings file comprises a plurality of relative amplitude settings for each of a plurality of frequency bands; and applying the retrieved predetermined equalizer settings to an equalizer that processes the received audio according to the predetermined equalizer settings in the predetermined equalizer settings file.

8 Claims, 13 Drawing Sheets

(51) Int. Cl.
*H03F 3/72*     (2006.01)
*H03G 5/16*     (2006.01)
*H03K 5/1532*   (2006.01)
*H03M 1/10*     (2006.01)
*H04L 12/10*    (2006.01)
*H04L 67/00*    (2022.01)
*H04L 67/06*    (2022.01)
*H04R 1/00*     (2006.01)
*H04R 5/04*     (2006.01)
*H04R 29/00*    (2006.01)
*H04W 76/10*    (2018.01)
*H03M 1/00*     (2006.01)

(52) U.S. Cl.
CPC ............ *H04W 76/10* (2018.02); *H03M 1/001* (2013.01); *H04R 2430/01* (2013.01)

AUDIO SYSTEM EQUALIZATION BASED ON TYPE OF AUDIO BEING BROADCAST

PRIORITY INFORMATION

The present application claims priority under 35 U.S.C. § 119(e) to U.S. Provisional Patent Application Ser. No. 63/282,320 filed Nov. 23, 2021, the entire contents of which are expressly incorporated herein by reference.

BACKGROUND OF THE INVENTION

Technical Field

The embodiments described herein relate generally to audio systems, and more particularly to systems, methods, and modes for an operating and improving audio systems.

Background Art

As those of skill in the art can appreciate, when different types of audio are received at an audio receiving device (e.g., a tuner and/or amplifier, among other types of audio receiving devices), there is often a lack of information as to the best equalization settings to maximize a user's listening experience. Current solutions on the market include tone profiles that can be selected manually (e.g., "Jazz," "Rock," "Classical," "Orchestra," "Voice," among others). These require user intervention and are not automated. Consequently, there can arise the issue of a first group of settings for pure voice—such as podcasts, or audio books—that is then incompatible when the use switches to music (which can also include sub-groups such as pop, rock, orchestra, big-band, and so on). Thus, users will have a subpar listening experience for different types of audio.

Accordingly, a need has arisen for systems, methods, and modes to automatically change and optimize equalization settings for an audio source based on the type of audio being broadcast.

SUMMARY

It is an object of the embodiments to substantially solve at least the problems and/or disadvantages discussed above, and to provide at least one or more of the advantages described below.

It is therefore a general aspect of the embodiments to provide systems, methods, and modes to automatically change equalization settings for an audio source based on the type of audio being broadcast that will obviate or minimize problems of the type previously described.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Further features and advantages of the aspects of the embodiments, as well as the structure and operation of the various embodiments, are described in detail below with reference to the accompanying drawings. It is noted that the aspects of the embodiments are not limited to the specific embodiments described herein. Such embodiments are presented herein for illustrative purposes only. Additional embodiments will be apparent to persons skilled in the relevant art(s) based on the teachings contained herein.

According to a first aspect of the embodiments, a method for optimizing audio equalization settings based on the type of music being broadcast is provided, comprising: receiving audio at a processing device; performing a frequency analysis of the received audio, to determine a plurality of frequency components and associated amplitudes of the frequency components of the received audio; generating a spectral plot of the received audio based on the performed frequency analysis of the received audio, wherein the spectral plot comprises an x axis that represents relative amplitude and a y axis that represents frequency components of the received audio; comparing the spectral plot of the received audio to each of a plurality of different predetermined spectral plots; matching the spectral plot of the received audio to at least one of a plurality of different predetermined spectral plots; retrieving a predetermined equalizer settings file that corresponds to the at least one of the matched predetermined spectral plots, wherein the predetermined equalizer settings file comprises a plurality of relative amplitude settings for each of a plurality of frequency bands; and applying the retrieved predetermined equalizer settings to an equalizer that processes the received audio according to the predetermined equalizer settings in the predetermined equalizer settings file.

According to the first aspect of the embodiments, the step of matching comprises: comparing amplitudes of the received audio to predetermined spectral plots that represent known genres of audio at a predetermined set of frequency values.

According to the first aspect of the embodiments, the predetermined set of frequency values comprises: are substantially continuous from about 20 Hz to about 20 kHz.

According to the first aspect of the embodiments, the predetermined set of frequency values comprises: a substantially uniform but not continuous set of frequency values between about 20 Hz to about 20 kHz.

According to the first aspect of the embodiments, the predetermined set of frequency values comprises: a substantially non-uniform and not continuous set of frequency values between about 20 Hz to about 20 kHz According to the first aspect of the embodiments, the predetermined set of frequency values are selected based on their relative amplitudes, such that the more dominant amplitude values in a genre are used to perform the matching.

According to a second aspect of the embodiments, a method for optimizing audio equalization settings based on the type of music being broadcast is provided, comprising: receiving audio at a processing device; obtaining metadata from the received audio data, wherein the metadata that corresponds to the received audio contains information that identifies the received audio data in regard to one or more of a genre, artist, and band name; matching the obtained metadata to previously stored metadata, such that one or more of the genre, artist, and band name can be obtained regarding the received audio data; retrieving a predetermined equalizer settings file that corresponds to one or more of the genre, artist, and band name of the received audio data, wherein the predetermined equalizer settings file comprises a plurality of relative amplitude settings for each of a plurality of frequency bands; and applying the retrieved predetermined equalizer settings to an equalizer that processes the received audio according to the predetermined equalizer settings in the predetermined equalizer settings file.

According to the second aspect of the embodiments, the step of matching comprises: comparing amplitudes of the received audio to predetermined spectral plots that represent known genres of audio at a predetermined set of frequency values.

According to the second aspect of the embodiments, the predetermined set of frequency values comprises: are substantially continuous from about 20 Hz to about 20 kHz.

According to the second aspect of the embodiments, the predetermined set of frequency values comprises: a substantially uniform but not continuous set of frequency values between about 20 Hz to about 20 kHz.

According to the second aspect of the embodiments, the predetermined set of frequency values comprises: a substantially non-uniform and not continuous set of frequency values between about 20 Hz to about 20 kHz According to the second aspect of the embodiments, the predetermined set of frequency values are selected based on their relative amplitudes, such that the more dominant amplitude values in a genre are used to perform the matching.

According to a third aspect of the embodiments, and audio distribution system is provided, comprising: at least one audio receiver, wherein the at least one audio receiver comprises: at least one processor; a memory operatively connected with the at least one processor, wherein the memory stores computer-executable instructions that, when executed by the at least one processor, causes the at least one processor to execute a method that comprises: receiving audio at a processing device; performing a frequency analysis of the received audio, to determine a plurality of frequency components and associated amplitudes of the frequency components of the received audio; generating a spectral plot of the received audio based on the performed frequency analysis of the received audio, wherein the spectral plot comprises an y axis that represents relative amplitude and a x axis that represents frequency components of the received audio; comparing the spectral plot of the received audio to each of a plurality of different predetermined spectral plots; matching the spectral plot of the received audio to at least one of a plurality of different predetermined spectral plots; retrieving a predetermined equalizer settings file that corresponds to the at least one of the matched predetermined spectral plots, wherein the predetermined equalizer settings file comprises a plurality of relative amplitude settings for each of a plurality of frequency bands; and applying the retrieved predetermined equalizer settings to an equalizer that processes the received audio according to the predetermined equalizer settings in the predetermined equalizer settings file.

According to the third aspect of the embodiments, the step of matching comprises: comparing amplitudes of the received audio to predetermined spectral plots that represent known genres of audio at a predetermined set of frequency values.

According to the third aspect of the embodiments, the predetermined set of frequency values comprises: are substantially continuous from about 20 Hz to about 20 kHz.

According to the third aspect of the embodiments, the predetermined set of frequency values comprises: a substantially uniform but not continuous set of frequency values between about 20 Hz to about 20 kHz.

According to the third aspect of the embodiments, the predetermined set of frequency values comprises: a substantially non-uniform and not continuous set of frequency values between about 20 Hz to about 20 kHz.

According to the third aspect of the embodiments, the predetermined set of frequency values are selected based on their relative amplitudes, such that the more dominant amplitude values in a genre are used to perform the matching.

According to a fourth aspect of the embodiments, and audio distribution system is provided, comprising: at least one audio receiver, wherein the at least one audio receiver comprises: at least one processor; a memory operatively connected with the at least one processor, wherein the memory stores computer-executable instructions that, when executed by the at least one processor, causes the at least one processor to execute a method that comprises: receiving audio at a processing device; obtaining metadata from the received audio data, wherein the metadata that corresponds to the received audio contains information that identifies the received audio data in regard to one or more of a genre, artist, and band name; matching the obtained metadata to previously stored metadata, such that one or more of the genre, artist, and band name can be obtained regarding the received audio data; retrieving a predetermined equalizer settings file that corresponds to one or more of the genre, artist, and band name of the received audio data, wherein the predetermined equalizer settings file comprises a plurality of relative amplitude settings for each of a plurality of frequency bands; and applying the retrieved predetermined equalizer settings to an equalizer that processes the received audio according to the predetermined equalizer settings in the predetermined equalizer settings file.

According to the fourth aspect of the embodiments, the step of matching comprises: comparing amplitudes of the received audio to predetermined spectral plots that represent known genres of audio at a predetermined set of frequency values.

According to the fourth aspect of the embodiments, the predetermined set of frequency values comprises: are substantially continuous from about 20 Hz to about 20 kHz.

According to the fourth aspect of the embodiments, the predetermined set of frequency values comprises: a substantially uniform but not continuous set of frequency values between about 20 Hz to about 20 kHz.

According to the fourth aspect of the embodiments, the predetermined set of frequency values comprises: a substantially non-uniform and not continuous set of frequency values between about 20 Hz to about 20 kHz According to the fourth aspect of the embodiments, the predetermined set of frequency values are selected based on their relative amplitudes, such that the more dominant amplitude values in a genre are used to perform the matching.

BRIEF DESCRIPTION OF THE DRAWINGS

The above and other objects and features of the embodiments will become apparent and more readily appreciated from the following description of the embodiments with reference to the following figures. Different aspects of the embodiments are illustrated in reference figures of the drawings. It is intended that the embodiments and figures disclosed herein are to be considered to be illustrative rather than limiting. The components in the drawings are not necessarily drawn to scale, emphasis instead being placed upon clearly illustrating the principles of the aspects of the embodiments. In the drawings, like reference numerals designate corresponding parts throughout the several views.

DETAILED DESCRIPTION

Figure 1:
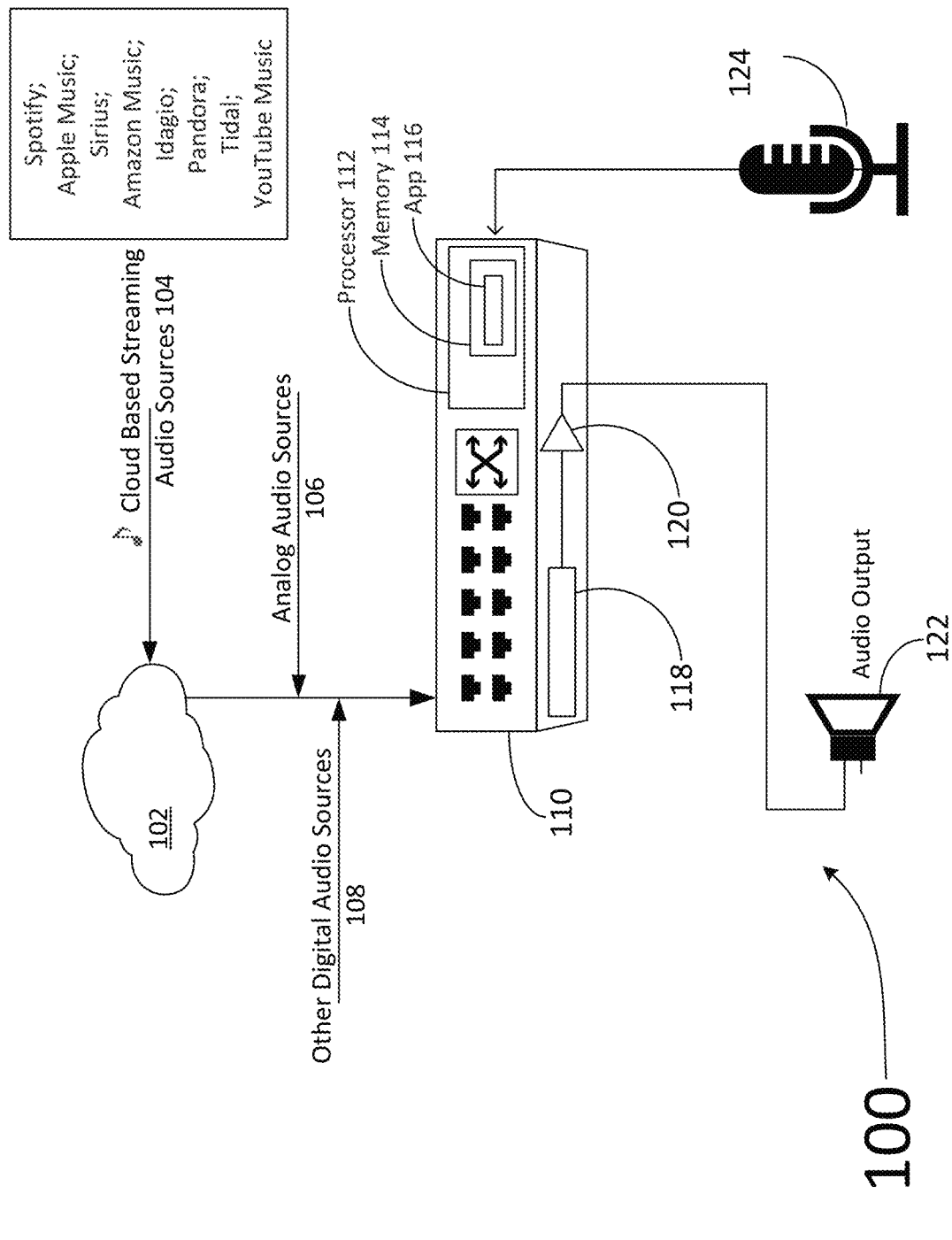
FIG. 1 illustrates an audio network within which optimized equalization settings for a specific type of audio are determined and then applied to the specific type of audio according to aspects of the embodiments.

The embodiments are described more fully hereinafter with reference to the accompanying drawings, in which embodiments of the inventive concept are shown. In the drawings, the size and relative sizes of layers and regions may be exaggerated for clarity. Like numbers refer to like elements throughout. The embodiments may, however, be embodied in many different forms and should not be construed as limited to the embodiments set forth herein. Rather, these embodiments are provided so that this disclosure will be thorough and complete, and will fully convey the scope of the inventive concept to those skilled in the art. The scope of the embodiments is therefore defined by the appended claims. The detailed description that follows is written from the point of view of a control systems company, so it is to be understood that generally the concepts discussed herein are applicable to various subsystems and not limited to only a particular controlled device or class of devices, such as audio networks, but can be used in virtually any type of audio playback system.

Reference throughout the specification to "one embodiment" or "an embodiment" means that a particular feature, structure, or characteristic described in connection with an embodiment is included in at least one embodiment of the embodiments. Thus, the appearance of the phrases "in one embodiment" or "in an embodiment" in various places throughout the specification is not necessarily referring to the same embodiment. Further, the particular feature, structures, or characteristics may be combined in any suitable manner in one or more embodiments.

The different aspects of the embodiments described herein pertain to the context of a systems, methods, and modes to automatically change and optimize equalization settings for an audio source based on the type of audio being broadcast, but is not limited thereto, except as may be set forth expressly in the appended claims.

For 40 years Crestron Electronics Inc., has been the world's leading manufacturer of advanced control and automation systems, innovating technology to simplify and enhance modern lifestyles and businesses. Crestron designs, manufactures, and offers for sale integrated solutions to control audio, video, computer, and environmental systems. In addition, the devices and systems offered by Crestron streamlines technology, improving the quality of life in commercial buildings, universities, hotels, hospitals, and homes, among other locations. Accordingly, the systems, methods, and modes described herein can improve audio systems as discussed below.

The systems, methods, and modes described herein detect the type of audio content received at an audio receiving device, and provide an optimized equalizer setting that can improve the clarity of the audio output.

In the following detailed description, references are made to the accompanying drawings that form a part hereof, and in which are shown by way of illustrations, specific embodiments, or examples. These aspects may be combined, other aspects may be utilized, and structural changes may be made without departing from the spirit or scope of the present disclosure. The following detailed description is therefore not to be taken in a limiting sense, and the scope of the present invention is defined by the appended claims and their equivalents.

While some embodiments will be described in the general context of program modules that execute in conjunction with an application program that runs on an operating system on a personal computer, those skilled in the art will recognize that aspects may also be implemented in combination with other program modules.

The Following is a List of the Elements of the Figures in Numerical Order

100 Audio Playback Network (APB NW)
102 Network
104 Cloud Based Digital Steaming Audio Sources 106 Analog Audio Sources
108 Digital Audio Sources
110 Digital Signal Processor
112 Processor
114 Memory
116 Audio Genre Determination Application (App)
118 Equalizer
120 Amplifier(s)
122 Loudspeaker(s)
124 Microphone (Mic)
200 Method for Optimizing Equalization Settings for the Specific Type of Audio
202-212 Method Steps of Method 200
306 Operating System (OS)
308 Internal Data/Command Bus (Bus)
312 Read-Only Memory (ROM)
314 Random Access Memory (RAM)
316 Printed Circuit Board (PCB)
318 Hard Disk Drive (HDD)
320 Universal Serial Bus (USB) Port
322 Ethernet Port
324 Video Graphics Array (VGA) Port or High Definition Multimedia Interface (HDMI)
326 Compact Disk (CD)/Digital Video Disk (DVD) Read/Write (RW) (CD/DVD/RW) Drive
328 Floppy Diskette Drive
330 Integrated Display/Touchscreen (Laptop/Tablet etc.)
332 Wi-Fi Transceiver
334 BlueTooth (BT) Transceiver
336 Near Field Communications (NFC) Transceiver
338 Third Generation (3G), Fourth Generation (4G), Fifth Generation (5G), Long Term Evolution (LTE) (3G/4G/5G/LTE) Cellular Transceiver
340 Communications Satellite/Global Positioning System (Satellite) Transceiver
342 Mouse
344 Scanner/Printer/Fax Machine
346 Universal Serial Bus (USB) Cable
348 High Definition Multi-Media Interface (HDMI) Cable
350 Ethernet Cable (CATS)
352 External Memory Storage Device
354 Flash Drive Memory
356 CD/DVD Diskettes
358 Floppy Diskettes
360 Keyboard
362 External Display/Touchscreen
364 Antenna
366 Shell/Box
390 Processing Device/Computer
402 Modulator/Demodulator (Modem)
404 Wireless Router (WiFi)
406 Internet Service Provider (ISP)
408 Server/Switch/Router
410 Internet
412 Cellular Service Provider
414 Cellular Telecommunications Service Tower (Cell Tower)
416 Satellite Control Station
418 Global Positioning System (GPS) Station
420 Satellite (Communications/GPS)
422 Mobile Electronic Device (MED)/Personal Electronic Device (PED)
424 Plain Old Telephone Service (POTS) Provider
500 Jazz Music Spectral Plot
600 Big-Band Music Spectral Plot
700 Classical Music Spectral Plot
800 Gospel Choir Music/Singing Spectral Plot
900 Talking Spectral Plot
1000 Unknown Audio Data Spectral Plot
1100 Equalizer Settings for Classical Music to Create a Substantially "Flat Spectral Response"
1200 Spectral Response of a First Room in regard to a Test Signal (First Room Spectral Response)
1250 Equalizer Settings for the First Room to Create a Flat Response in regard to the Test Signal Used throughout the specification are several acronyms, the meanings of which are provided as follows:

3G Third Generation
4G Fourth Generation
5G Fifth Generation
6G Sixth Generation
APB NW Audio Playback Network
API Application Programming Interface
App Executable Software Programming Code/Application
ASIC Application Specific Integrated Circuit
BIOS Basic Input/Output System
BT BlueTooth
CD Compact Disk
CRT Cathode Ray Tube
DVD Digital Video Disk
EEPROM Electrically Erasable Programmable Read Only Memory
FPGA Field Programmable Gate Array
GAN Global Area Network
GPS Global Positioning System
GUI Graphical User Interface
HDD Hard Disk Drive
HDMI High Definition Multimedia Interface
ISP Internet Service Provider
LCD Liquid Crystal Display
LED Light Emitting Diode Display
LTE Long Term Evolution
MODEM Modulator-Demodulator
NFC Near Field Communications
OS Operating System
PC Personal Computer
PDF Portable Document Form
PED Personal Electronic Device
POTS Plain Old Telephone Service
PROM Programmable Read Only Memory
RAM Random Access Memory
ROM Read-Only Memory
RW Read/Write
USB Universal Serial Bus (USB) Port
UV Ultraviolet Light
UVPROM Ultraviolet Light Erasable Programmable Read Only Memory
VGA Video Graphics Array Generally, program modules include routines, programs, components, data structures, and other types of structures that perform particular tasks or implement particular abstract data types. Moreover, those of skill in the art can appreciate that different aspects of the embodiments can be practiced with other computer system configurations, including handheld devices, multiprocessor systems, microprocessor-based or programmable consumer electronics, minicomputers, mainframe computers, and comparable computing devices. Aspects of the embodiments can also be practiced in distributed computing environments where tasks are performed by remote processing devices that are linked through a communications network. In a distributed computing environment, program modules can be located in both local and remote memory storage devices.

Aspects of the embodiments can be implemented as a computer-implemented process (method), a computing system, or as an article of manufacture, such as a computer program product or computer readable media. The computer program product can be a computer storage medium readable by a computer system and encoding a computer program that comprises instructions for causing a computer or computing system to perform example process(es). The computer-readable storage medium is a computer-readable memory device. The computer-readable storage medium can for example be implemented via one or more of a volatile computer memory, a non-volatile memory, a hard drive, a flash drive, a floppy disk, or a compact disk, and comparable hardware media.

Throughout this specification, the term "platform" can be a combination of software and hardware components for providing share permissions and organization of content in an application with multiple levels of organizational hierarchy. Examples of platforms include, but are not limited to, a hosted service executed over a plurality of servers, an application executed on a single computing device, and comparable systems. The term "server" generally refers to a computing device executing one or more software programs typically in a networked environment. More detail on these technologies and example operations is provided below.

A computing device, as used herein, refers to a device comprising at least a memory and one or more processors that includes a server, a desktop computer, a laptop computer, a tablet computer, a smart phone, a vehicle mount computer, or a wearable computer. A memory can be a removable or non-removable component of a computing device configured to store one or more instructions to be executed by one or more processors. A processor can be a component of a computing device coupled to a memory and configured to execute programs in conjunction with instructions stored by the memory. Actions or operations described herein may be executed on a single processor, on multiple processors (in a single machine or distributed over multiple machines), or on one or more cores of a multi-core processor. An operating system is a system configured to manage hardware and software components of a computing device that provides common services and applications. An integrated module is a component of an application or service that is integrated within the application or service such that the application or service is configured to execute the component. A computer-readable memory device is a physical computer-readable storage medium implemented via one or more of a volatile computer memory, a non-volatile memory, a hard drive, a flash drive, a floppy disk, or a compact disk, and comparable hardware media that includes instructions thereon to automatically save content to a location. A user experience can be embodied as a visual display associated with an application or service through which a user interacts with the application or service. A user action refers to an interaction between a user and a user experience of an application or a user experience provided by a service that includes one of touch input, gesture input, voice command, eye tracking, gyroscopic input, pen input, mouse input, and keyboards input. An application programming interface (API) can be a set of routines, protocols, and tools for an application or service that allow the application or service to interact or communicate with one or more other applications and services managed by separate entities.

While example implementations are described using audio networks herein, embodiments are not limited to such applications. For example, aspects of the embodiments can be employed in stand-alone audio systems, such as a room in a building that can play be audio through a dedicated system not connected to any network. As discussed previously, different types of audio can be played back in an audio system and if the audio signal is not advantageously equalized based on the type of audio, then the quality of the playback can suffer. Different types of audio data content can include, but are not limited to, voice, singing, jazz, classical, big band, string ensembles, marching bands, among others. Furthermore, some audio can be used with video, and some video can switch between different types of audio data during the course of the video program.

Technical advantages exist for automatically applying equalizer settings for different genre's of audio data utilizing the aspects of the embodiments that include optimizing the listening experience, and increasing audio fidelity. Such technical advantages can include, but are not limited to, the ability to switch among different audio data genres without having to manually change equalizer settings, which can save a significant amount of time, and furthermore which can prevent people from failing to hear audio data when it can be vitally important, such as in a subway system and there is an emergency, and the audio data switches from background music to emergency messages.

Aspects of the embodiments address a need that arises from very large scale of operations created by networked computing and cloud-based services that cannot be managed by humans. The actions/operations described herein are not a mere use of a computer, but address results of a system that is a direct consequence of software used as a service such as audio network communication services offered in conjunction with communications.

While some embodiments will be described in the general context of program modules that execute in conjunction with an application program that runs on an operating system on a personal computer, those skilled in the art will recognize that aspects may also be implemented in combination with other program modules.

FIGS. 1-13 illustrate various aspects of a system and method for generating and applying optimal equalizer settings in an audio network for use on one or more computing devices, including, according to certain aspects of the embodiments, use of the internet or other similar networks. The optimal equalizer settings program provides a practical, technical solution to the problem of substantially automatically and instantaneously providing optimized equalizer settings when different audio genres are received for playback; as those of skill in the art can appreciate, the aspects of the embodiments have no "analog equivalent" as its embodiments reside solely or substantially in the physical device or computer domain. That is, substantially automatically and substantially instantaneously obtaining and then setting the optimized equalizer settings always meant, and continues to mean, using practical, non-abstract physical devices. The technological improvement of the aspects of the embodiments resides in at least in the ability to quickly and easily generate and apply the optimal equalizer settings, through the use of sophisticated algorithms that can determine the type of audio data using sophisticated computer hardware.

FIG. 1 illustrates audio playback network (APB NW) 100 within which optimized equalization settings can be determined automatically in accordance with aspects of the embodiments. APB NW 100 comprises network 102, which can be virtually any type of network, including but not limited to a local area network (LAN), global area network (GAN), the internet, among other types of networks. Accessible through network 102 are one or more cloud based streaming audio sources 104; the audio data output by the one or more cloud based streaming audio sources 104 are received by digital signal processor (DSP) 110. As those of ordinary skill in the art can appreciate, APB NW 100 can further comprise audio/video receivers and/or other devices that interface first with the one or more cloud based streaming sources 104, but in fulfillment of the dual purposes of clarity and brevity, such devices have been omitted from this discussion, but can be used.

Other inputs to DSP 110 can include analog sources 106 (turntables, output of conventional radio sets, and the like), and other digital audio sources 108 (e.g., a compact disk (CD) and digital video disk (DVD) players, and the like). If the received audio data is analog, it will first be converted to a digital audio signal, so that it can be processed by DSP 110.

DSP 110 itself comprises one or more processors 112, memory 114, and Audio Genre Determination Application (App) 116, as well as a significant amount of other software and applications that provide for audio data processing and data manipulation and user interfaces, all of which are known to those of skill in the art, and therefore in fulfillment of the dual purposes of clarity and brevity have not been discussed herein.

Following processing/manipulation by App 116, audio data is then sent to equalizer 118, converted to an analog signal through use of one or more digital to analog converters (DACs; not shown), and then amplified by at least one amplifier 120, prior to being broadcast by one or more loudspeakers 122. APB NW 100 further comprises microphone (mic) 124.

In APB NW 100, network connected DSP 110 receives audio data through network 102 or via a separate analog input or digital input. Those of skill in the can appreciate that the audio data source can be from a legacy audio input like an RCA connector (analog input). As described above, audio can be received through network 102 from cloud 104, such as a Podcast from an online Podcast service. According to an aspects of the embodiments, DSP 110 receives the audio data, buffers the audio data, and then begins analyzing the audio data. DSP 110 will analyze the frequencies playing back, creating a spectral plot of amplitudes versus frequencies (which can be any range within about 20 Hz to about 20 kHz).

As those of skill in the are can appreciate, a spectral plot is a graph which allows us to examine the cyclic structure, in the frequency domain, of a time series. A time series represents a progression of some parameter in time. As those of skill in the art can appreciate, the time series is a function of time, but it is typically random; that is, it cannot be predicted what it will do in the future exactly, only what it might do. In technical terms, a spectral plot is a smoothed Fourier transform of the auto-covariance function of the time series.

According to aspects of the embodiments there is an optimal tone setting (i.e., equalizer settings) for substantially all of the different genres of audio data. Such optimal tone settings can be identified for the various types of audio data detected (conferencing audio, podcast audio, jazz music, rock or contemporary music, classical music, "big band" music, among others) and have a matching tone profile for equalizer 118 that can be implemented on the fly to optimize output for all these types of audio data. By way of non-limiting example, in the case of a Podcast, or other kind of audio program in which a person is talking, DSP 110 will see that most of the content is in the voiceband (an adult male ranges in frequency from about 80-180 Hz, and an adult female ranges in frequency from about 165 to about 255 Hz), and then optimize the audio data prior to being broadcast to loudspeaker 122 to improve clarity.

According to aspects of the embodiments, there can be separate equalizer settings for audio music and audio voice. According to further aspects of the embodiments, these and/or other settings can be combined with equalization settings that are unique and specific to the room in which the audio music/voice is being played back in. That is, there can be an optimal set of equalizer settings for a room such that the room's "spectral response," or "frequency response," is substantially flat or even, so that there are little or no audio frequency "peaks" or "valleys" (i.e., no noticeable losses or gains in amplitude for any frequency in the audible spectrum). Such a process can be referred to as "tuning a room."

According to aspects of the embodiments, the different sets of equalizer settings can be generated by a user (via a graphical user interface of App 116 (not shown, but which can be used on a mobile electronic device (MED), or computer, which is locally or remotely connected), or can be generated automatically by App 16 that characterizes the room and generates an equalizer setting that flattens the response for the different genres of audio data.

According to aspects of the embodiments, different equalizer settings can be stored based on the type of audio—there are some preferred tones for different audio. For instance, pop boosts the midrange, where spoken word you boost the core vocal frequencies, and for rock you usually slightly boost high and low frequencies and slope down in the 300-1 kHz range. These equalizer spectrums have evolved over time and, in general, they are based on the recommendations of audio production engineers, as well as artist preferences.

As described above, it is known that a characterization of a room in which an audio system is located will indicate "peaks" and "valleys" of amplitudes for different frequencies in the human audible hearing range (about 20 Hz to about 20 kHz). Typically, an installer of such an audio system will want a substantially flat response characterization—i.e., one in which there are very little or no valleys and peaks of amplitudes over the human audible hearing range. There could exist a first set of equalizer settings that achieves such a flattened response for the particular room that the audio data is being broadcast into. The second set of equalizer settings are the ones that a user has generated and stored for a first particular type of audio data that is being broadcast into the room. Aspects of the embodiments, through use of App 116, will obtain the first and second set of equalizer settings and reconcile them to generate a third set such that the desired response for the audio data is achieved in the room. This is shown in regard to FIG. 13, and discussed in greater below.

According to further aspects of the embodiments, such optimized tone settings can also be used in audio that accompanies video. According to still further aspects of the embodiments, the video output signal itself can also be optimized based on content of the input video signal. If the source is a PC, then the video processor can change to focus on text versus if the content is sports from a cable box where the optimization would be for motion pictures.

For example, a video that is a motion picture with mainly spoken words, and very little music, might use an optimized tone setting for just spoken works. If one or more people are singing, however, such as a video of a choir or something similar (with little or no accompanying music), then a different set of optimized tone settings can be used. If, however, the video is of an orchestra, jazz band, or other contemporary music ensemble, with relatively little singing, then the optimized tone settings would be, respectively, those predetermined for orchestra, jazz music, and so on.

Figure 2:
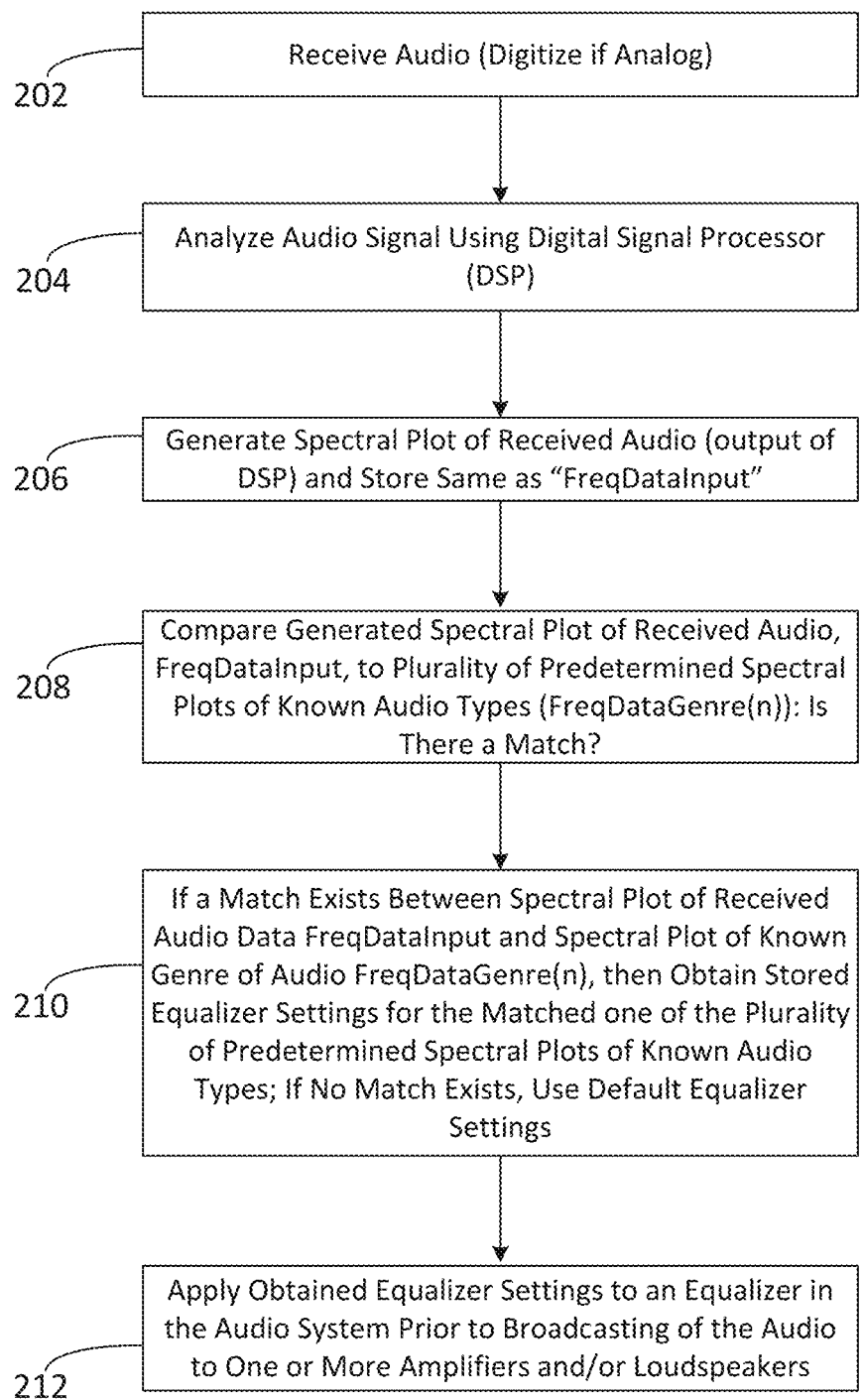
FIG. 2 illustrates a flow chart of a method for optimizing equalization settings for the specific type of audio according to aspects of the embodiments.

FIG. 2 illustrates a flow chart of method 200 for optimizing equalization settings for the specific type of audio according to aspects of the embodiments. Method 200 is performed by App 116, stored in memory 114, and executed by processor 112, the steps of storing and execution known to a person of ordinary skill in the art.

Method 200 begins with method step 202. In method step 202 audio is received at DSP 110. According to aspects of the embodiments, the audio received can be in digital form or in an analog form (which would then be digitized prior to further processing, as described below in regard to method steps 204-212).

Figure 6:
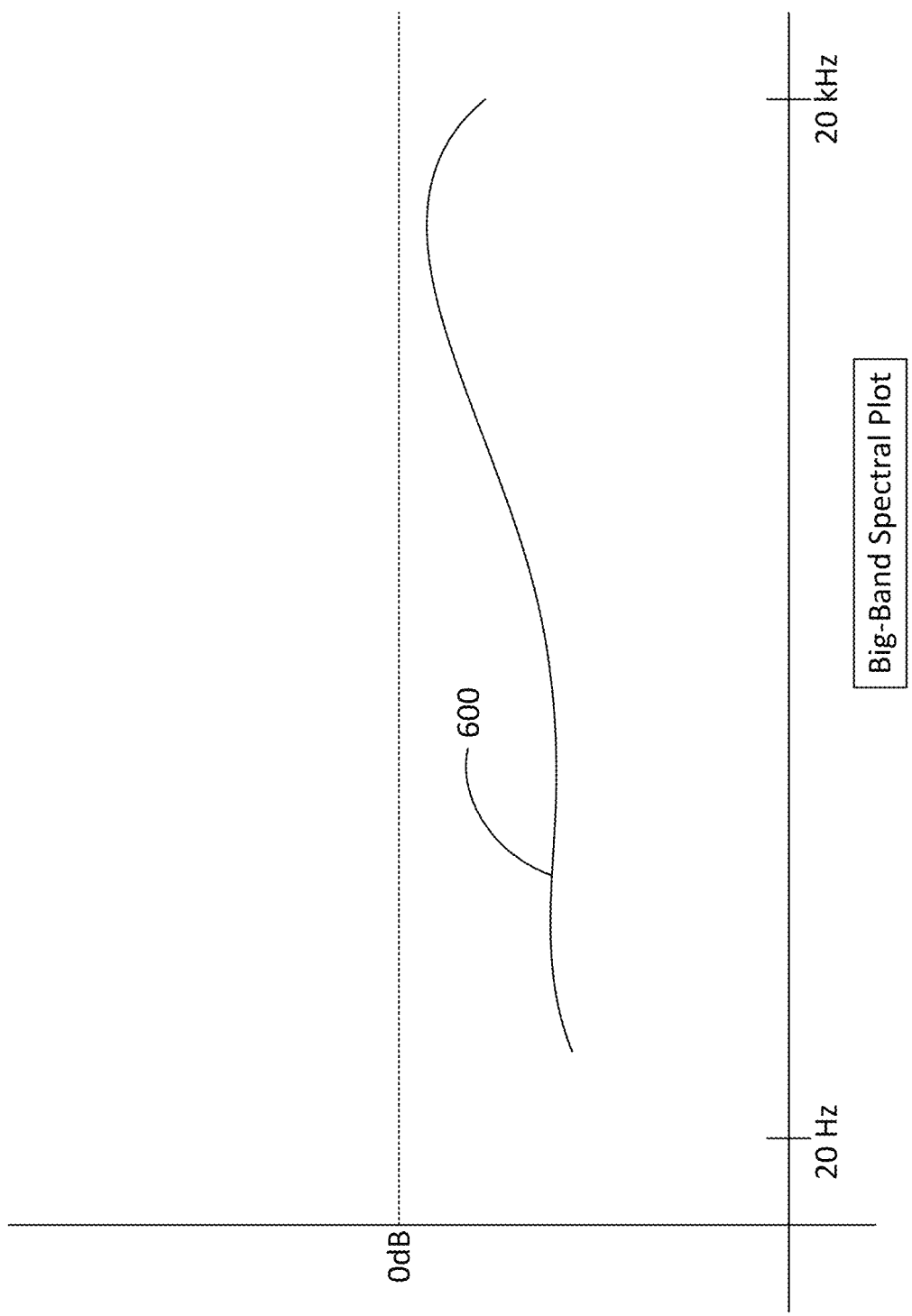
FIG. 6 illustrates a spectral plot of a third genre of audio as generated by a digital signal processor, the genre of audio being Big-band music.
Figure 7:
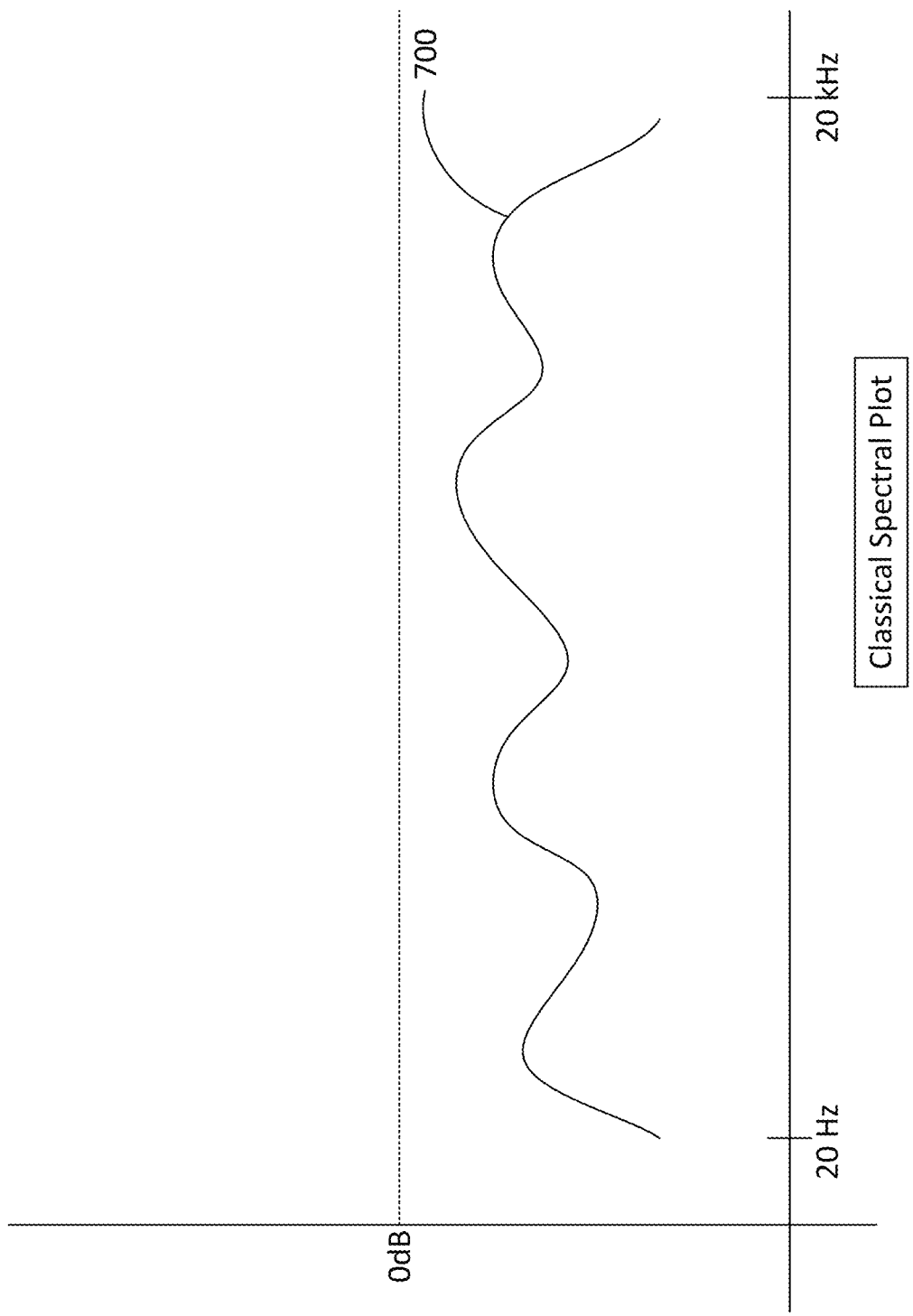
FIG. 7 illustrates a spectral plot of a second genre of audio as generated by a digital signal processor, the genre of audio being Classical music.
Figure 8:
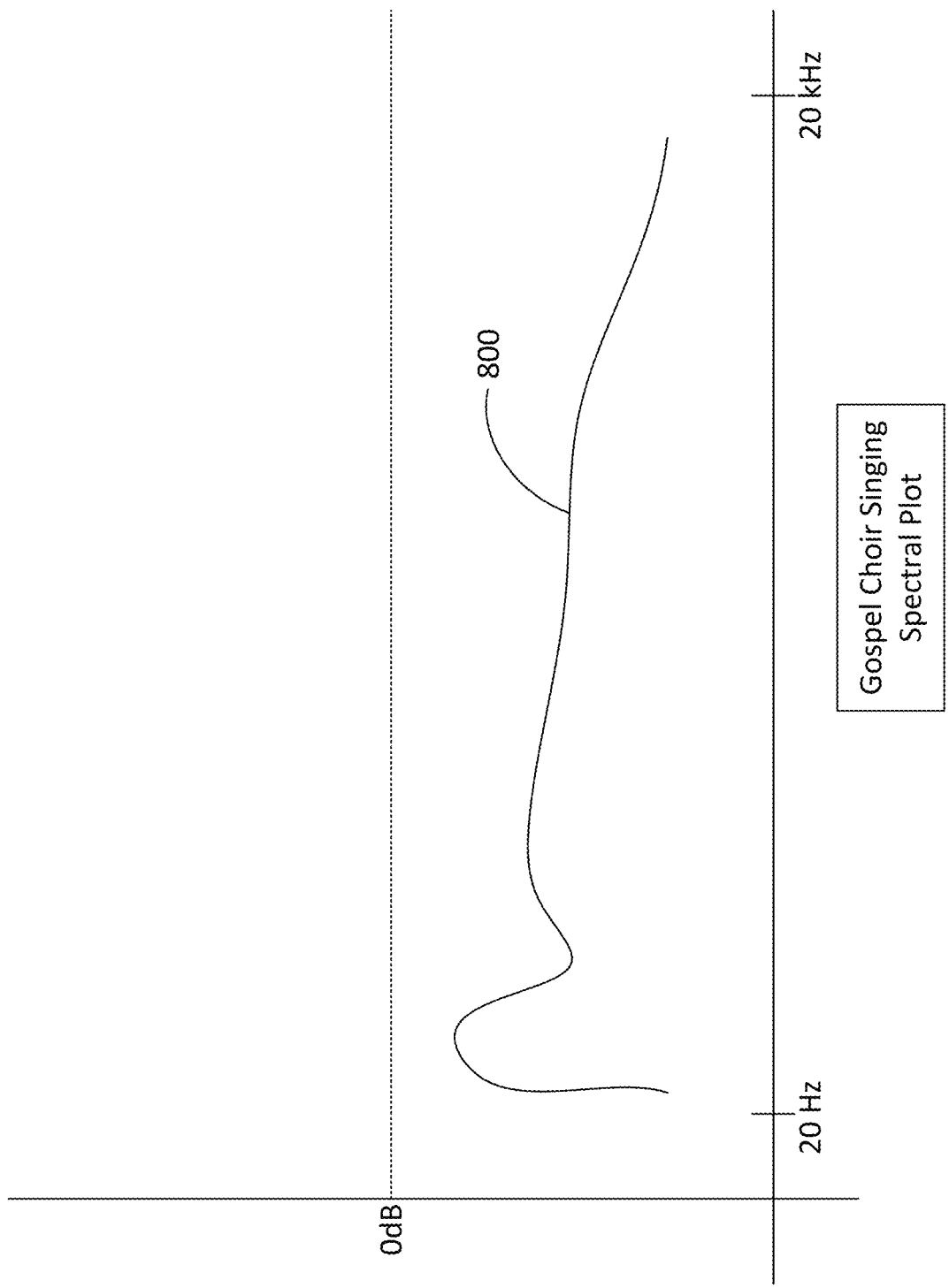
FIG. 8 illustrates a spectral plot of a fourth genre of audio as generated by a digital signal processor, the genre of audio being Gospel choir singing.

In method step 204, digitized or digital audio is analyzed by DSP 110. DSP 110 can used software and/or hardware based versions of discrete Fourier Transforms to determine the frequency components (or spectral components) of the received audio and respective amplitudes thereof. In method step 206, DSP 110 generates a spectral plot, or amplitude-frequency plot, which plots the relative amplitudes of different frequency components of the audio signal received by DSP 110, and stores the same as, by non-limiting example, "FreqDataInput." According to aspects of the embodiments, the digitized audio data can be frequency analyzed over a first period of time, or periodically and then averaged, in order to ascertain what type of audio has been received by DSP 110. Examples of different genres of audio as illustrated by their respective spectral plots are shown in FIGS. 5-9 (FIG. 5=Jazz music; FIG. 6=Big-band music; FIG. 7=Classical music; FIG. 8=Gospel choir singing; and FIG. 9=an adult female talking).

In decision step 208, App 116 compares the spectral plot data, FreqDataInput, of the received audio data to prestored spectral plots of known genres of audio data (FreqDataGenre(n)) in order to match, as closely as possible, the received audio data to a known type of audio data. That is, in decision step 208, App 116 compares FreqDataInput to each of the stored spectral plots represented in FIGS. 5-9, but there can be others as well. A non-limiting example of how such a match occurs is shown in FIG. 10 according to aspects of the embodiments.

Figure 10:
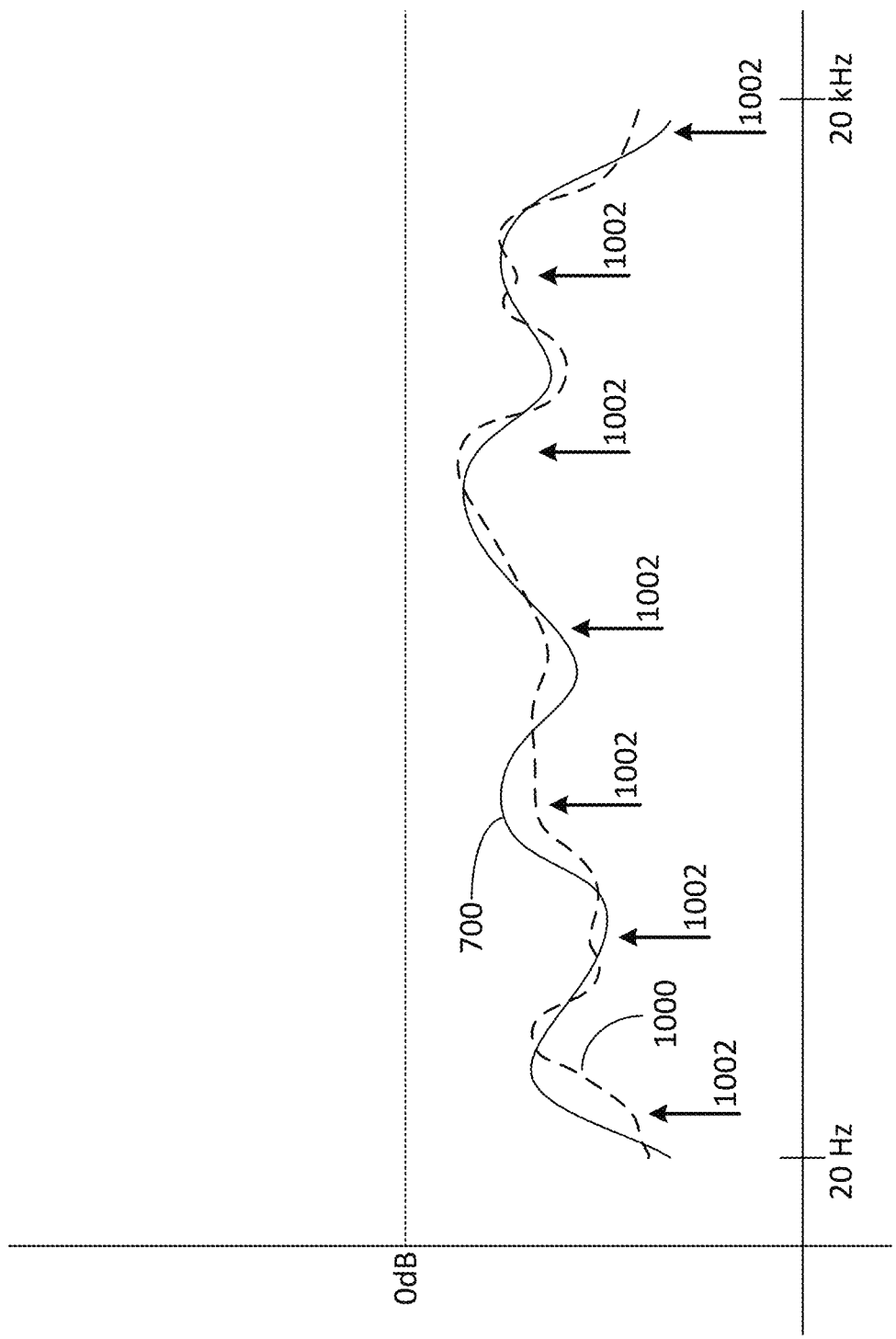
FIG. 10 illustrates a first example of a spectral plot of unknown audio data that will be compared to the spectral plots of known audio genres to determine a closest match so that a pre-determined set of equalizer settings can be obtained and applied to an equalizer that will process the received audio data prior to being broadcast according to aspects of the embodiments.

In FIG. 10, the spectral response of unknown audio data is labeled spectral plot 1000; according to an aspect of the embodiments, at predetermined frequencies the amplitude of spectral plot 1000 is compared to a spectral plot 700 that represents the spectral plot of Classical music; the predetermined frequencies are indicated by the arrows 1002. At each particular frequency, the amplitudes of spectral plot 700 and spectral plot 1000 are compared and a value obtained (the difference between the two amplitudes). The absolute value of each amplitude difference can then be obtained, and summed together. The resultant value, "Amplitude_Comparison_Value (700-1000)" (or "ACV (700-1000)) is then compared to other ACVs (determined for different spectral plots 500, 600, 800 and 900, among others), and the one with the lowest ACV is determined to be the type of audio data that matches the unknown audio data. This is but one of many non-limiting methods for matching the unknown audio data to the known audio spectral plots. In this case, it was determined that unknown audio data 1000 matches closest to Classical music, and method 200 proceeds to method step 210.

According to further aspects of the embodiments, the predetermined frequency values at which to obtain amplitude values can be substantially continuous (i.e., each frequency from 20 Hz to 20 kHz (about 20,000 values), substantially uniform but not continuous (e.g., every 10 Hz, or 20 Hz, or some other non-random interval), substantially non-uniform and not continuous (e.g., randomized, different intervals between 20 Hz and 20 kHz), among other means for determining the ACV. According to further aspects of the embodiments, the frequencies that are selected can be selected based on their relative amplitudes—that is, those that are more dominant in a genre than others can be used for purposes of matching.

If there is a close enough match between the spectral plot of the received audio data (FreqData(n)) to a spectral plot of known audio data (FreqDataGenre(n)), then in method step 210, App 116 obtains the equalizer settings associated with the matched spectral plot for the particular genre of audio data, and in method step 212, App 116 transmits the equalizer settings to equalizer 118, which then processes the received audio data according to the new equalizer settings prior to outputting the audio data (in analog form) to amplifier(s) 120, and loudspeaker(s) 122 to be broadcast.

If, however, there is not a close enough match between the spectral data FreqDataInput of the received audio data and any of the known spectral plots FreqDataGenre(n), then a default equalizer setting is used in steps 210 and 212. Such default equalizer setting can be determined by the user, or determined by another means according to aspects of the embodiments.

According to further aspects of the embodiments, in addition to the matching steps discussed above, or as an alternative thereto, a user can establish a list of audio data types (User Audio Data List) that can be compared to the incoming unknown audio data. In such case, there can be metadata associated with the unknown audio data that includes the genre, the name of the artist(s) and/or band, the year of production/release and other relevant information. The user can use App 116 to compare the metadata for each incoming unknown audio data to the user provided User Audio Data List, and if a match exists, then the user-provided equalizer settings for that specific match can be obtained from memory and supplied to equalizer 118 to process the unknown audio data.

By way of non-limiting example, the user can create a User Audio Data List that includes the name of a band such as "Pink Floyd." For such type of rock music, the user has created a particular set of equalizer settings and labeled the same "Pink Floyd EQ Settings" within App 116. Within App 116 there can be functional operations that provide the user with the ability to create and label such equalizer settings, and label them, and even provide different levels of search settings. For example, there can be "Pink Floyd EQ Settings—pre-1973" for Pink Floyd songs that pre-date their most popular album, "Dark Side of the Moon."

As briefly described above, FIGS. 5-9 illustrate various spectral plots of different genres of audio data that have been stored in APB NW 100 for use in comparing to spectral plots of unknown audio data, as described above in regard to FIGS. 1 and 2, and in reference to FIGS. 9 and 10. The spectral plots of FIGS. 5-9 are illustrative only, and are not to be taken in a limiting manner, as there are many other different types of audio data that can be represented by spectral plots.

Figure 5:
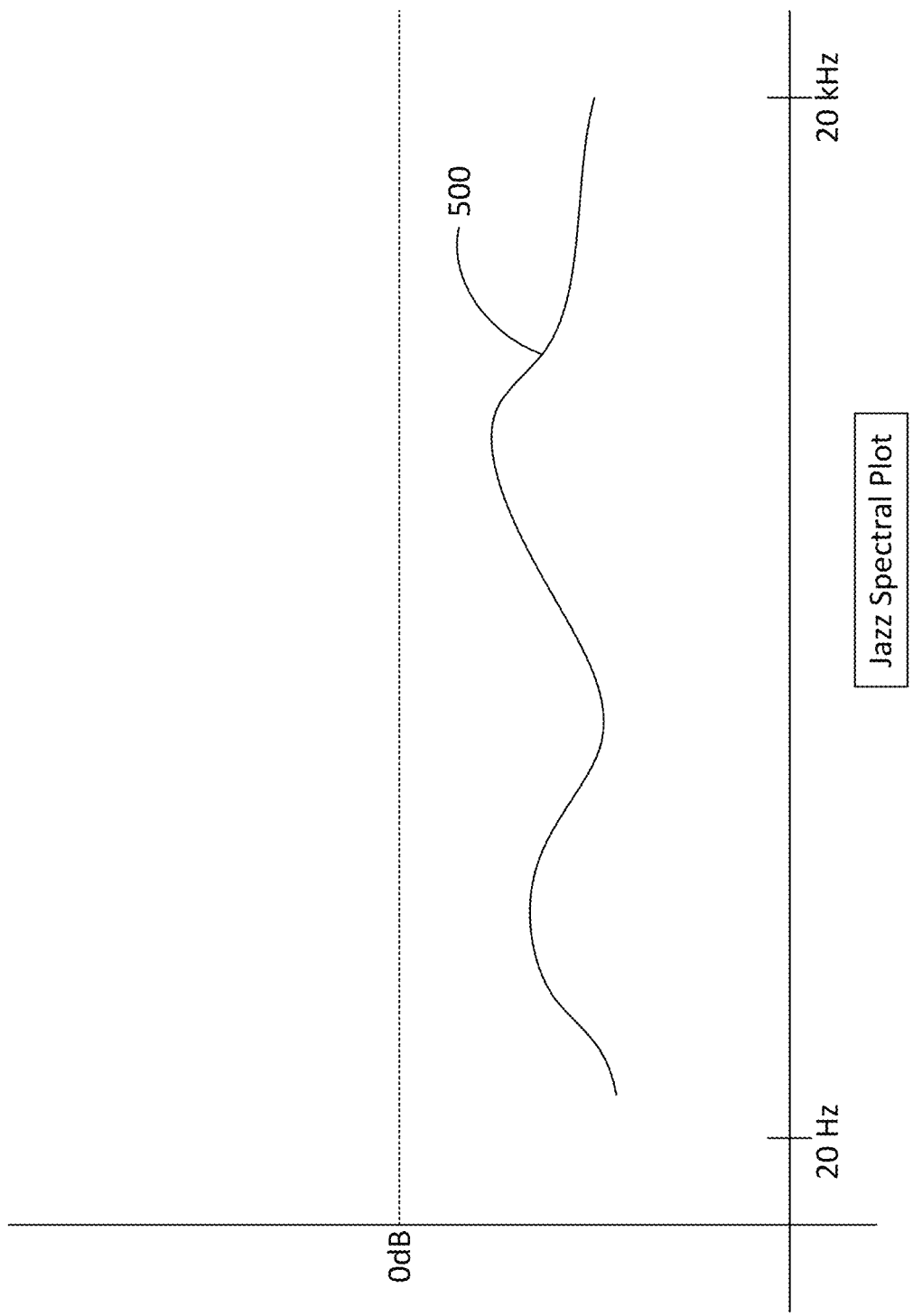
FIG. 5 illustrates a spectral plot of a first genre of audio as generated by a digital signal processor, the genre of audio being Jazz music.
Figure 9:
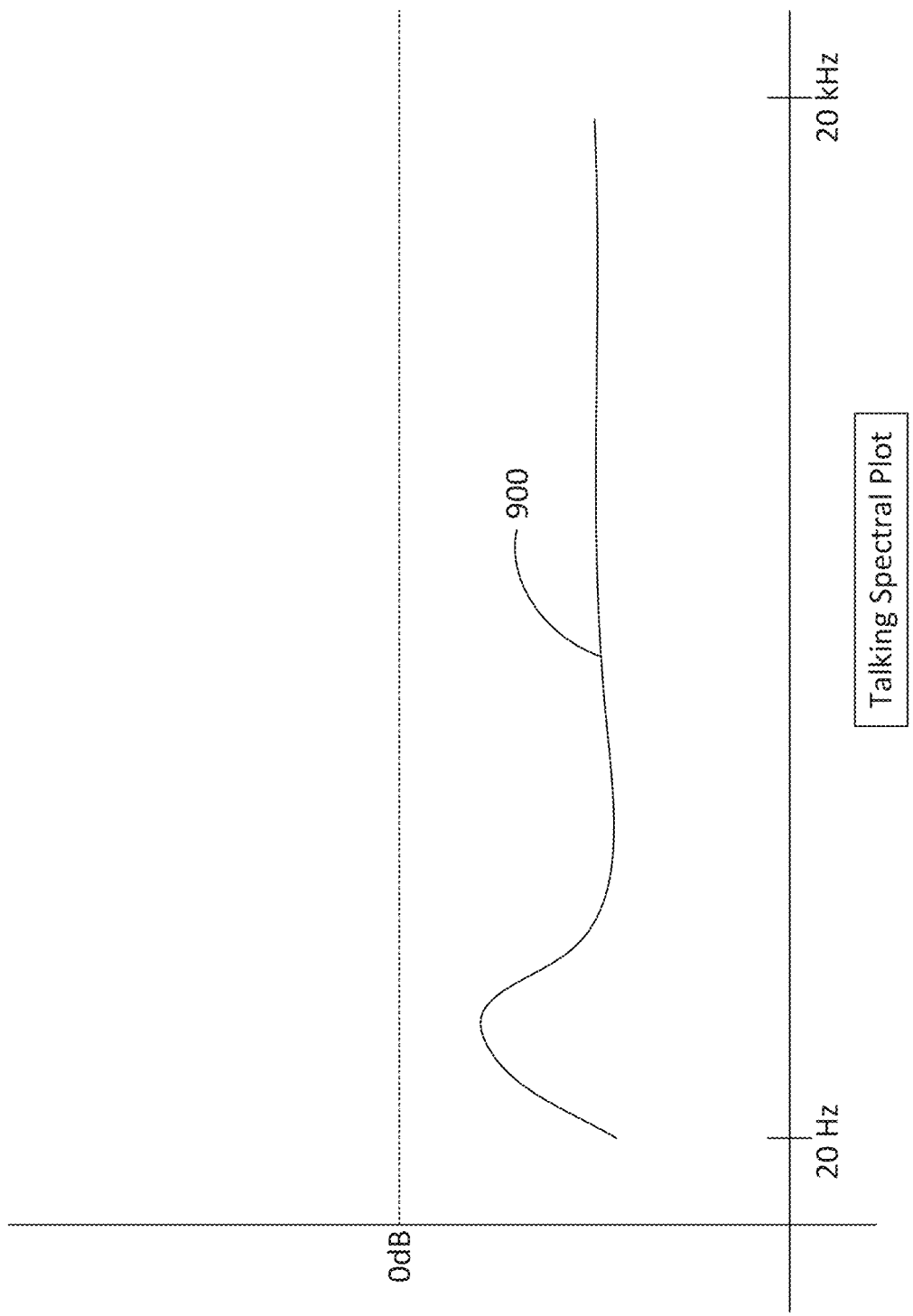
FIG. 9 illustrates a spectral plot of a fifth genre of audio as generated by a digital signal processor, the genre of audio being a person talking.

FIG. 5 illustrates spectral plot 500 of a first genre of audio as generated by a digital signal processor, the genre of audio being Jazz music. FIG. 6 illustrates spectral plot 600 of a second genre of audio as generated by a digital signal processor, the genre of audio being Big-band music. Big band is a style of music defined by an ensemble of musicians, known as a jazz orchestra, playing together. Big band music includes complex harmonies and syncopated rhythms. A vocalist or instrumental soloist is often featured, adding a melody on top of the jazz orchestra. Examples of well known band leaders include Benny Goodman, Glenn Miller, Harry James, and Jimmy Dorsey. FIG. 7 illustrates spectral plot 700 of a third genre of audio as generated by a digital signal processor, the genre of audio being Classical music. FIG. 8 illustrates spectral plot 800 of a fourth genre of audio as generated by a digital signal processor, the genre of audio being Gospel choir singing. FIG. 9 illustrates spectral plot 900 of a fifth genre of audio as generated by a digital signal processor, the genre of audio being a person talking.

Figure 11:
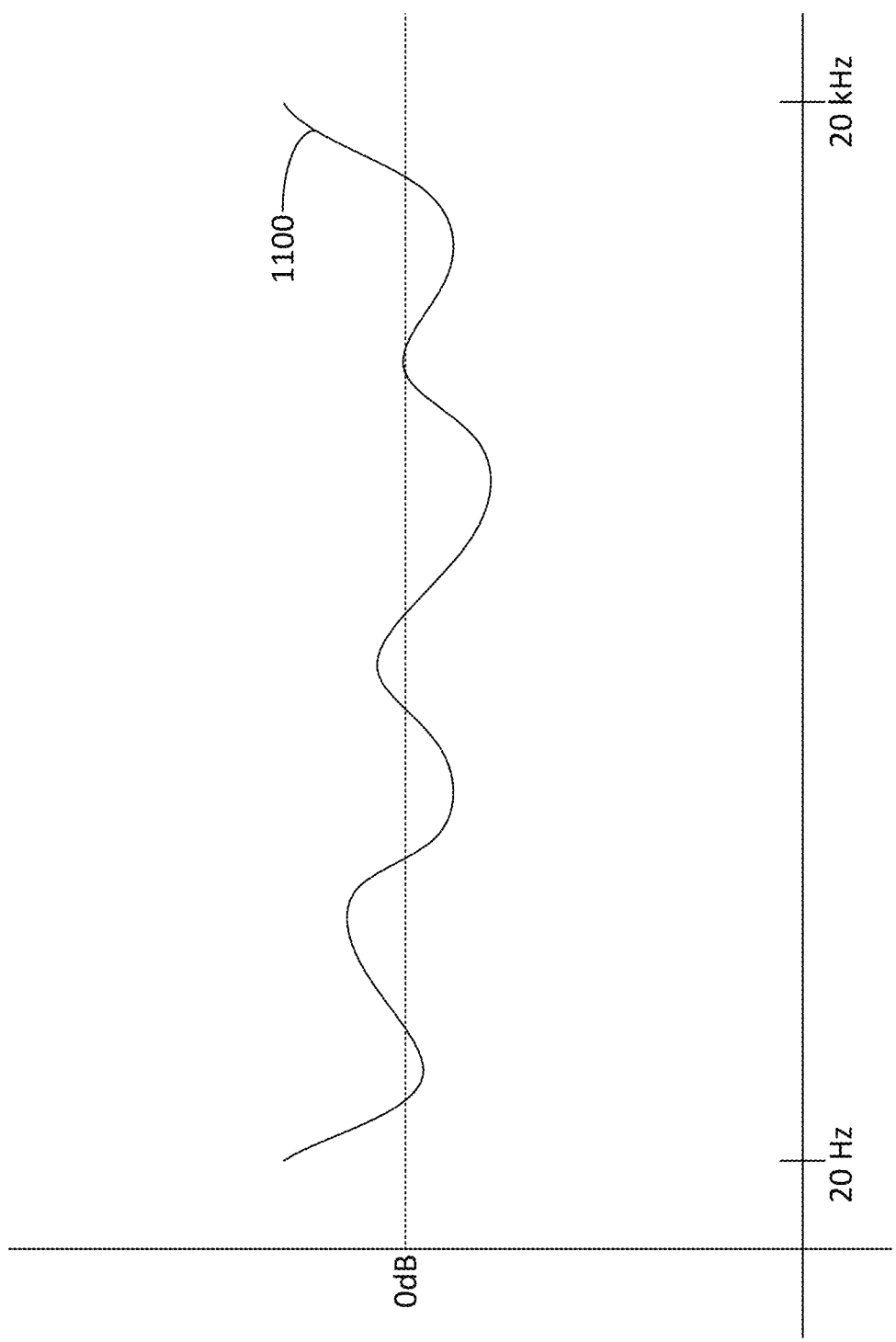
FIG. 11 illustrates a first set of equalizer settings for an equalizer ((that can be part of a digital signal processor)) as shown in the audio distribution system of FIG. 1 to compensate for the frequency response of classical music such that the output of the audio system is substantially even across substantially the entire audio spectrum according to aspects of the embodiments.

As discussed in detail above, FIG. 10 illustrates spectral plot 1000 of unknown audio data that will be compared to the spectral plots (in this non-limiting case, spectral plots 500, 600, 700, 800, and 900 of known audio genres to determine a closest match so that a pre-determined set of equalizer settings can be obtained and applied to an equalizer that will process the received audio data prior to being broadcast according to aspects of the embodiments. FIG. 11 illustrates a first set of equalizer settings for equalizer 118 that is part of DSP 110 that corresponds to spectral plot 700, Classical music. According to aspects of the embodiments, a set of equalizer settings can be automatically generated that substantially flattens or evens out the audio response to the genre of audio data that is being broadcast through APB NW 100; thus, equalizer settings 1100 is an inverse of spectral plot 700, which is associated with Classical music.

Figure 12:
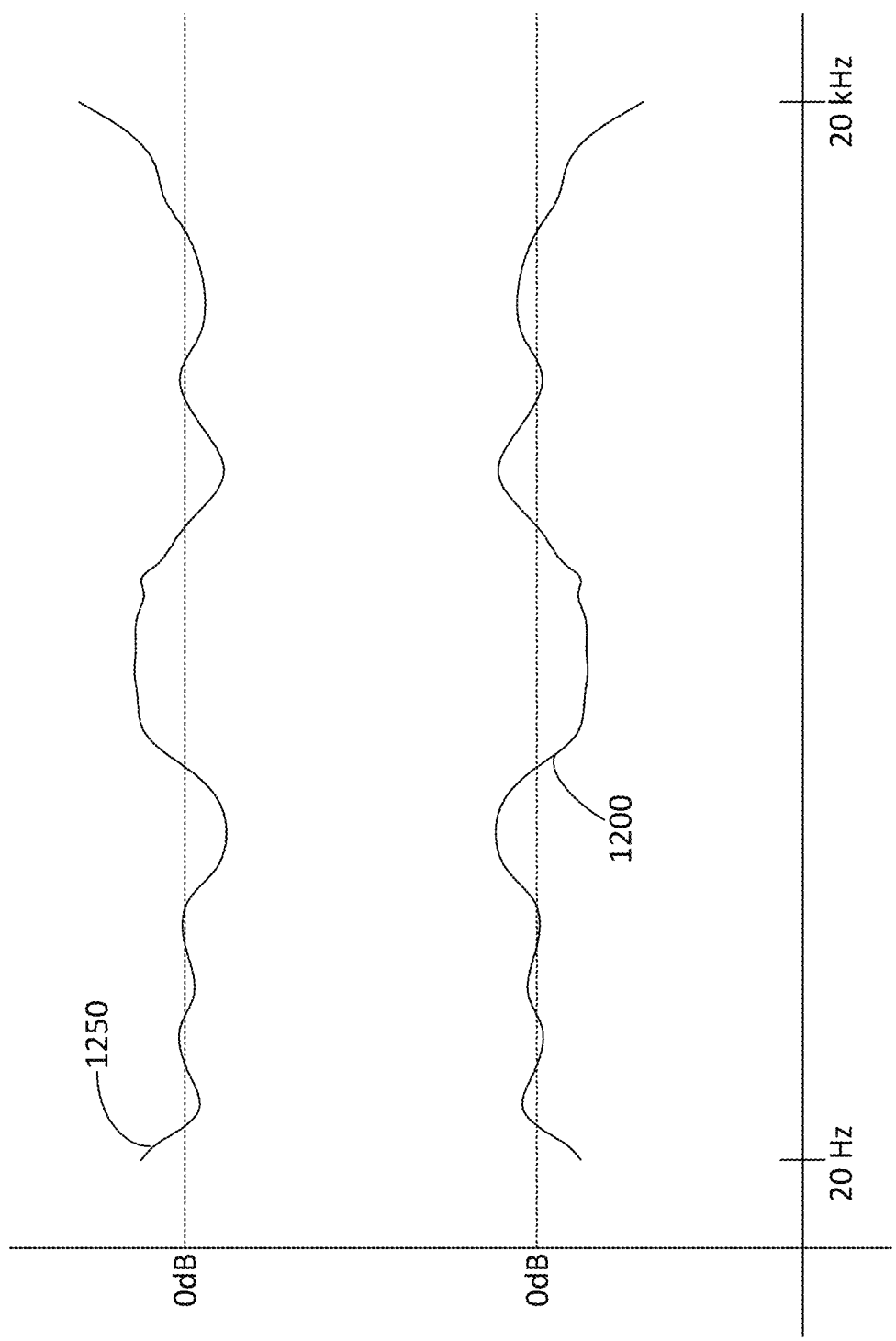
FIG. 12 illustrates a frequency (spectral) response of a first room within which an audio system using the aspects of the embodiments is located, and a second set of equalizer settings for an equalizer that compensates for the spectral response of the first room, such that a substantially flattened frequency response is obtained when audio data is broadcast into the first room according to aspects of the embodiments.

FIG. 12 illustrates a frequency (spectral) response of a first room (first room spectral response 1200) within which APB NW 100 using the aspects of the embodiments is located, and a corresponding set of equalizer settings 1250 for an equalizer that compensates for first room spectral response 1200 of the first room, such that a substantially flattened frequency response is obtained when audio data is broadcast into the first room according to aspects of the embodiments.

According to aspects of the embodiments, equalizer settings 1250 is a substantial inverse of first room spectral response 1200; that is, where there are "dropouts" or reductions of amplitude in first room spectral response 1200 (e.g., at or about 20 Hz, first room spectral response 1200 has an amplitude that is below the 0 dB reference line), at the same frequency, there is a gain that substantially matches the attenuation in the first room spectral response 1200. As those of skill in the art can appreciate, however, first room spectral response 1200 is typically obtained through use of "white noise" or some other specially tailored set of audio spectrum signals (e.g., pink noise, among others).

Figure 13:
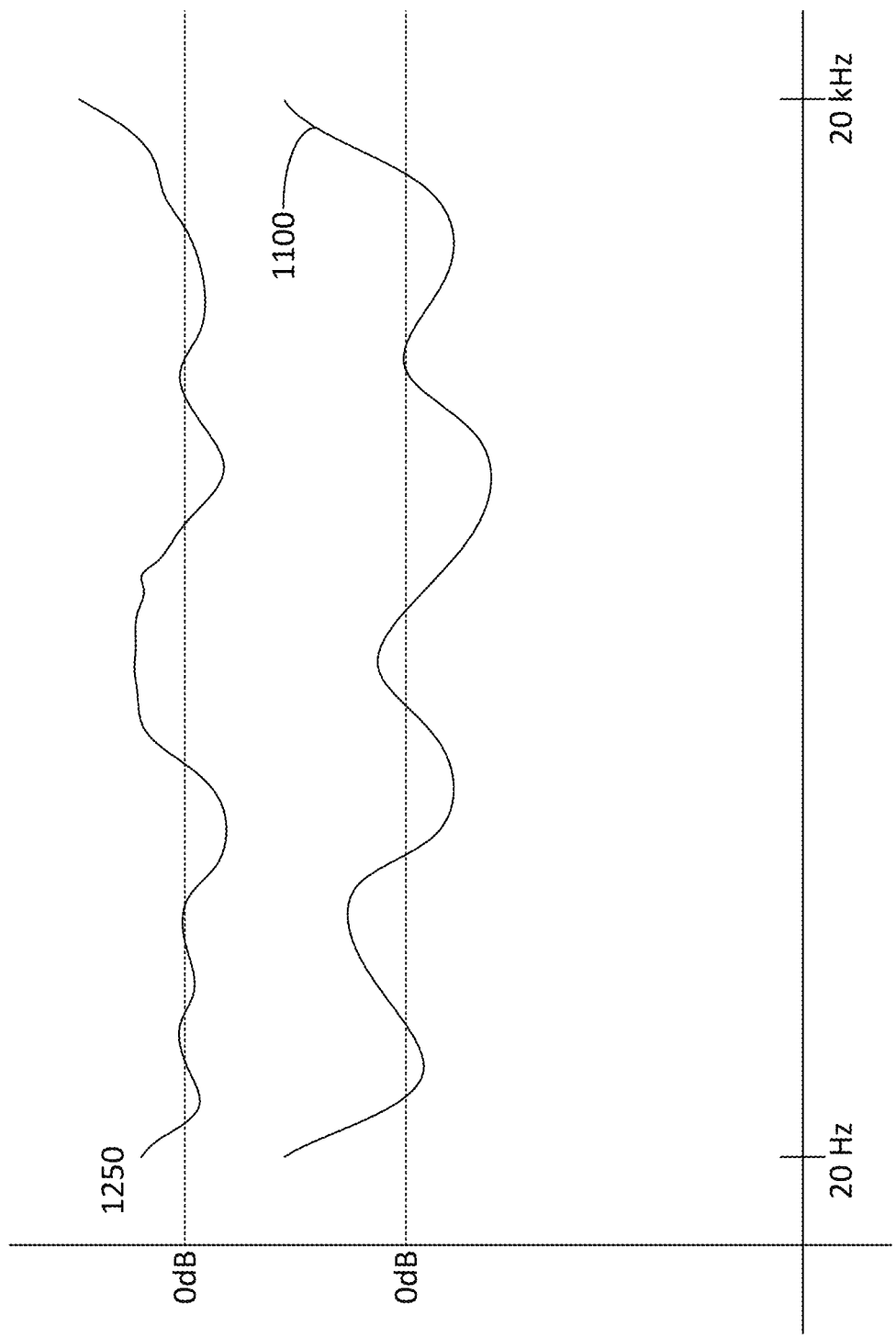
FIG. 13 illustrates a first set of equalizer settings for a first genre of audio data and the set of equalizer settings shown in FIG. 12, such that when combined, a substantially flattened frequency response in the first room is obtained for the first genre of audio data that is being broadcast into the room according to aspects of the embodiments.

FIG. 13 illustrates a first set of equalizer settings 1100 for a first genre of audio data and the set of equalizer settings 1250 shown in FIG. 12, such that when combined, a substantially flattened frequency response in the first room is obtained for the first genre of audio data that is being broadcast into the room according to aspects of the embodiments.

Figure 3:
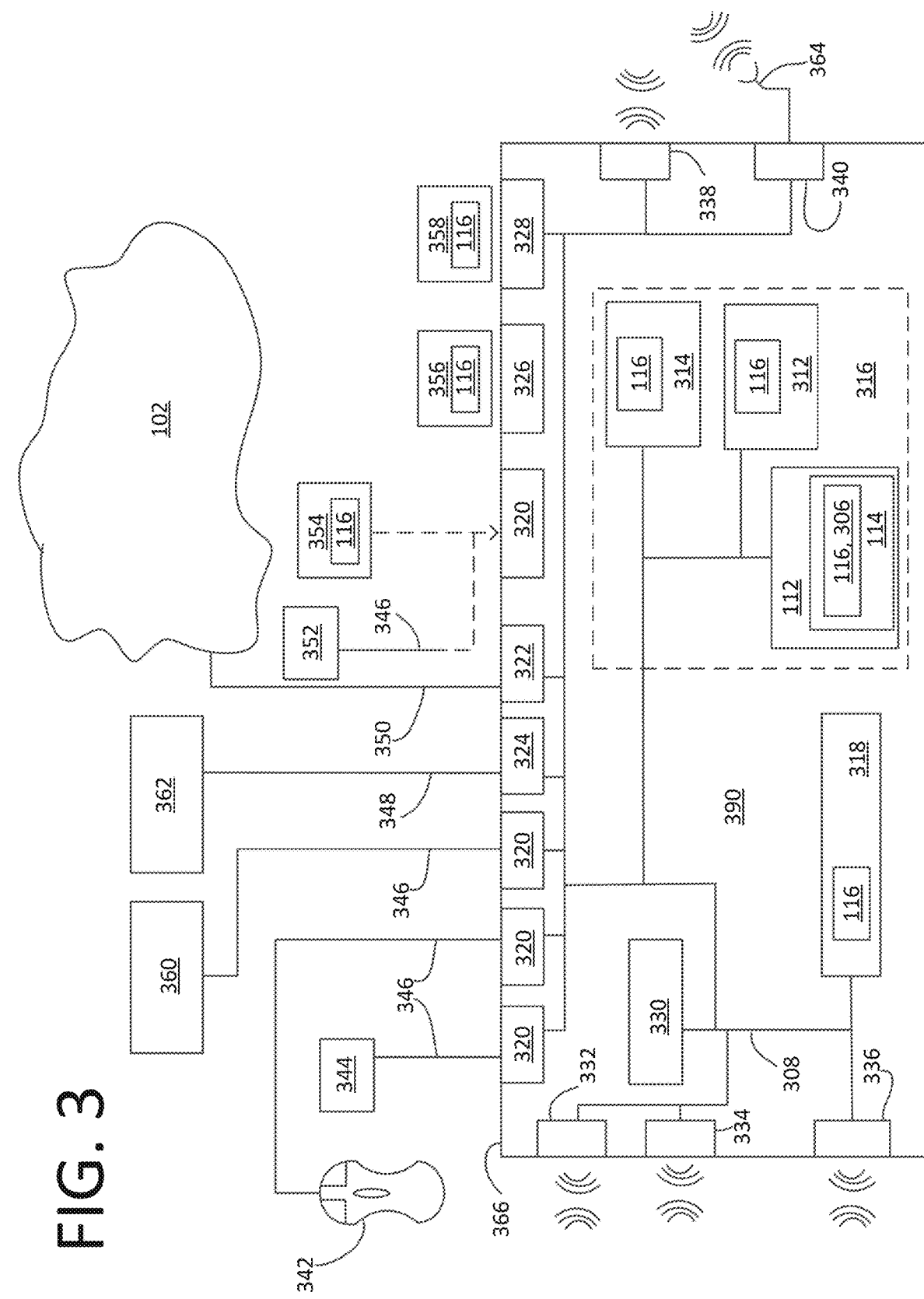
FIG. 3 illustrates a block diagram of the major components of a personal computer (PC), server, laptop, personal electronic device (PED), personal digital assistant (PDA), tablet (e.g., iPad), or any other computer/processor (herein after, "processor") suitable for use to implement the method shown in FIG. 2, for optimizing equalization settings for the specific type of audio according to aspects of the embodiments.

FIG. 3 illustrates a block diagram of the major components of a personal computer (PC), server, laptop, personal electronic device (PED), personal digital assistant (PDA), tablet (e.g., iPad), or any other processing device/computer 390 (herein after, "computer 390") suitable for use to implement method 200 among others, for optimizing equalization settings for the specific type of audio, according to aspects of the embodiments. Computer 390 comprises, among other items, a shell/box 366, integrated display/touchscreen 330 (though not used in every application of the computer), internal data/command bus (bus) 308, printed circuit board (PCB) 316, and one or more processors 112, with processor memory 114 (which can be typically read only memory (ROM) and/or random access memory (RAM)). Those of ordinary skill in the art can appreciate that in modern computer systems, parallel processing is becoming increasingly prevalent, and whereas a single processor would have been used in the past to implement many or at least several functions, it is more common currently to have a single dedicated processor for certain functions (e.g., digital signal processors) and therefore could be several processors, acting in serial and/or parallel, as required by the specific application. Computer 390 further comprises multiple input/output ports, such as universal serial bus (USB) ports 320, Ethernet ports 322, and video graphics array (VGA) ports/high definition multimedia interface (HDMI) ports 324, among other types. Further, computer 390 includes externally accessible drives such as compact disk (CD)/digital versatile disk (DVD) read/write (RW) (CD/DVD/RW) drive 326, and floppy diskette drive 328 (though less used currently, some computers still include this type of interface). Computer 390 still further includes wireless communication apparatus, such as one or more of the following: Wi-Fi transceiver 332, BlueTooth (BT) transceiver 334, near field communications (NFC) transceiver 336, third generation (3G)/fourth Generation (4G)/long term evolution (LTE)/fifth generation (5G) transceiver (cellular transceiver) 338, communications satellite/global positioning system (satellite) transceiver 340, and antenna 364.

Internal memory that is located on PCB 316 itself can comprise hard disk drive (HDD) 318 (these can include conventional magnetic storage media, but, as is becoming increasingly more prevalent, can include flash drive memory 354, among other types), ROM 312 (these can include electrically erasable programmable ROM (EEPROMs), ultra-violet erasable PROMs (UVPROMs), among other types), and RAM 314. Usable USB port 320 is flash drive memory 354, and usable with CD/DVD/RW drive 326 are CD/DVD diskettes (CD/DVD) 356 (which can be both read and write-able). Usable with floppy diskette drive 328 are floppy diskettes 358. External memory storage device 352 can be used to store data and programs external to computer 390, and can itself comprise another HDD 318, flash drive memory 354, among other types of memory storage. External memory storage device 352 is connectable to computer 390 via USB cable 346. Each of the memory storage devices, or the memory storage media (1406, 318, 312, 314, 352, 354, 356, and 358, among others), can contain parts or components, or in its entirety, executable software programming code or application that has been termed App 116 according to aspects of the embodiments, which can implement part or all of the portions of method 200 among other methods not shown, described herein.

In addition to the above described components, computer 390 also comprises keyboard 360, external display 362, printer/scanner/fax machine 344, and mouse 342 (although not technically part of the computer 390, the peripheral components as shown in FIGS. 3 (352, 362, 360, 342, 354, 356, 358, 346, 350, 344, and 348) are adapted for use with computer 390 that for purposes of this discussion they shall be considered as being part of the computer 390). Other cable types that can be used with computer 390 include RS 232, among others, not shown, that can be used for one or more of the connections between computer 390 and the peripheral components described herein. Keyboard 360, and mouse 342 are connectable to computer 390 via USB cable 346, and external display 362 is connectible to computer 390 via VGA cable/HDMI cable 348. Computer 390 is connectible to network 102 via Ethernet port 322 and Ethernet cable 350 via a router and modulator-demodulator (MODEM) and internet service provider, none of which are shown in FIG. 3. All of the immediately aforementioned components (324, 352, 362, 360, 342, 354, 356, 358, 346, 350, and 344) are known to those of ordinary skill in the art, and this description includes all known and future variants of these types of devices.

External display 362 can be any type of currently available display or presentation screen, such as liquid crystal displays (LCDs), light emitting diode displays (LEDs), plasma displays, cathode ray tubes (CRTs), among others (including touch screen displays). In addition to the user interface mechanism such as mouse 342, computer 390 can further include a microphone, touch pad, joystick, touch screen, voice-recognition system, among other inter-active inter-communicative devices/programs, which can be used to enter data and voice, and which all of are currently available and thus a detailed discussion thereof has been omitted in fulfillment of the dual purposes of clarity and brevity.

As mentioned above, computer 390 further comprises a plurality of wireless transceiver devices, such as Wi-Fi transceiver 332, BT transceiver 334, NFC transceiver 336, cellular transceiver 338, satellite transceiver 340, and antenna 364. While each of Wi-Fi transceiver 332, BT transceiver 334, NFC transceiver 336, cellular transceiver 338, and satellite transceiver 340 has their own specialized functions, each can also be used for other types of communications, such as accessing a cellular service provider (not shown), accessing network 102 (which can include the Internet), texting, emailing, among other types of communications and data/voice transfers/exchanges, as known to those of skill in the art. Each of Wi-Fi transceiver 332, BT transceiver 334, NFC transceiver 336, cellular transceiver 338, satellite transceiver 340 includes a transmitting and receiving device, and a specialized antenna, although in some instances, one antenna can be shared by one or more of Wi-Fi transceiver 332, BT transceiver 334, NFC transceiver 336, cellular transceiver 338, and satellite transceiver 340. Alternatively, one or more of Wi-Fi transceiver 332, BT transceiver 334, NFC transceiver 336, cellular transceiver 338, and satellite transceiver 340 will have a specialized antenna, such as satellite transceiver 340 to which is electrically connected at least one antenna 364.

In addition, computer 390 can access network 102 (of which the Internet can be part of, as shown and described in FIG. 4 below), either through a hard wired connection such as Ethernet port 322 as described above, or wirelessly via Wi-Fi transceiver 332, cellular transceiver 338 and/or satellite transceiver 340 (and their respective antennas) according to aspects of the embodiments. Computer 390 can also be part of a larger network configuration as in a global area network (GAN) (e.g., internet), which ultimately allows connection to various landlines.

According to further aspects of the embodiments, integrated touch screen display 330, keyboard 360, mouse 342, and external display 362 (if in the form of a touch screen), can provide a means for a user to enter commands, data, digital, and analog information into the computer 390. Integrated and external displays 330, 362 can be used to show visual representations of acquired data, and the status of applications that can be running, among other things.

Bus 308 provides a data/command pathway for items such as: the transfer and storage of data/commands between processor 112, Wi-Fi transceiver 332, BT transceiver 334, NFC transceiver 336, cellular transceiver 338, satellite transceiver 340, integrated display 330, USB port 320, Ethernet port 322, VGA/HDMI port 324, CD/DVD/RW drive 326, floppy diskette drive 328, and processor memory 114. Through bus 308, data can be accessed that is stored in memory 114. Processor 112 can send information for visual display to either or both of integrated and external displays 330, 362, and the user can send commands to the computer operating system (operating system (OS)) 306 that can reside in processor memory 114 of processor 112, or any of the other memory devices (356, 358, 318, 312, and 314).

Computer 390, and either internal memories 114, 312, 314, and 318, or external memories 352, 354, 356 and 358, can be used to store computer code that when executed, implements method 200, as well as other methods not shown and discussed, for optimizing equalization settings for the specific type of audio, according to aspects of the embodiments. Hardware, firmware, software, or a combination thereof can be used to perform the various steps and operations described herein. According to aspects of the embodiments, App 116 for carrying out the above discussed steps can be stored and distributed on multi-media storage devices such as devices 318, 312, 314, 354, 356 and/or 358 (described above) or other form of media capable of portably storing information. Storage media 354, 356 and/or 358 can be inserted into, and read by devices such as USB port 320, CD/DVD/RW drive 326, and floppy diskette drive 328, respectively.

As also will be appreciated by one skilled in the art, the various functional aspects of the aspects of the embodiments can be embodied in a wireless communication device, a telecommunication network, or as a method or in a computer program product. Accordingly, aspects of embodiments can take the form of an entirely hardware embodiment or an embodiment combining hardware and software aspects. Further, the aspects of embodiments can take the form of a computer program product stored on a computer-readable storage medium having computer-readable instructions embodied in the medium. Any suitable computer-readable medium can be utilized, including hard disks, CD-ROMs, DVDs, optical storage devices, or magnetic storage devices such a floppy disk or magnetic tape. Other non-limiting examples of computer-readable media include flash-type memories or other known types of memories.

Further, those of ordinary skill in the art in the field of the aspects of the embodiments can appreciate that such functionality can be designed into various types of circuitry, including, but not limited to field programmable gate array structures (FPGAs), application specific integrated circuitry (ASICs), microprocessor based systems, among other types. A detailed discussion of the various types of physical circuit implementations does not substantively aid in an understanding of the aspects of the embodiments, and as such has been omitted for the dual purposes of brevity and clarity. However, the systems and methods discussed herein can be implemented as discussed and can further include programmable devices.

Such programmable devices and/or other types of circuitry as previously discussed can include a processing unit, a system memory, and a system bus that couples various system components including the system memory to the processing unit. The system bus can be any of several types of bus structures including a memory bus or memory controller, a peripheral bus, and a local bus using any of a variety of bus architectures. Furthermore, various types of computer readable media can be used to store programmable instructions. Computer readable media can be any available media that can be accessed by the processing unit. By way of example, and not limitation, computer readable media can comprise computer storage media and communication media. Computer storage media includes volatile and nonvolatile as well as removable and non-removable media implemented in any method or technology for storage of information such as computer readable instructions, data structures, program modules or other data. Computer storage media includes, but is not limited to, RAM, ROM, EEPROM, flash memory or other memory technology, CD-ROMs, DVDs or other optical disk storage, magnetic cassettes, magnetic tape, magnetic disk storage or other magnetic storage devices, or any other medium which can be used to store the desired information, and which can be accessed by the processing unit. Communication media can embody computer readable instructions, data structures, program modules or other data in a modulated data signal such as a carrier wave or other transport mechanism and can include any suitable information delivery media.

The system memory can include computer storage media in the form of volatile and/or nonvolatile memory such as ROM and/or RAM. A basic input/output system (BIOS), containing the basic routines that help to transfer information between elements connected to and between the processor, such as during start-up, can be stored in memory. The memory can also contain data and/or program modules that are immediately accessible to and/or presently being operated on by the processing unit. By way of non-limiting example, the memory can also include an operating system, application programs, other program modules, and program data.

The processor can also include other removable/non-removable and volatile/nonvolatile computer storage media. For example, the processor can access a hard disk drive that reads from or writes to non-removable, nonvolatile magnetic media, a magnetic disk drive that reads from or writes to a removable, nonvolatile magnetic disk, and/or an optical disk drive that reads from or writes to a removable, nonvolatile optical disk, such as a CD-ROM or other optical media. Other removable/non-removable, volatile/nonvolatile computer storage media that can be used in the operating environment include, but are not limited to, magnetic tape cassettes, flash memory cards, digital versatile disks, digital video tape, solid state RAM, solid state ROM and the like. A hard disk drive can be connected to the system bus through a non-removable memory interface such as an interface, and a magnetic disk drive or optical disk drive can be connected to the system bus by a removable memory interface, such as an interface.

Aspects of the embodiments discussed herein can also be embodied as computer-readable codes on a computer-readable medium. The computer-readable medium can include a computer-readable recording medium and a computer-readable transmission medium. The computer-readable recording medium is any data storage device that can store data which can be thereafter read by a computer system. Examples of the computer-readable recording medium include ROM, RAM, CD-ROMs and generally optical data storage devices, magnetic tapes, flash drives, and floppy disks. The computer-readable recording medium can also be distributed over network coupled computer systems so that the computer-readable code is stored and executed in a distributed fashion. The computer-readable transmission medium can transmit carrier waves or signals (e.g., wired, or wireless data transmission through the Internet). Also, functional programs, codes, and code segments to, when implemented in suitable electronic hardware, accomplish or support exercising certain elements of the appended claims can be readily construed by programmers skilled in the art to which the aspects of the embodiments pertains.

The disclosed aspects of the embodiments provide a system and method for optimizing equalization settings for the specific type of audio, according to aspects of the embodiments, on one or more computers 390. It should be understood that this description is not intended to limit aspects of the embodiments. On the contrary, aspects of the embodiments are intended to cover alternatives, modifications, and equivalents, which are included in the spirit and scope of the aspects of the embodiments as defined by the appended claims. Further, in the detailed description of the aspects of the embodiments, numerous specific details are set forth to provide a comprehensive understanding of the claimed aspects of the embodiments. However, one skilled in the art would understand that various aspects of the embodiments can be practiced without such specific details.

Figure 4:
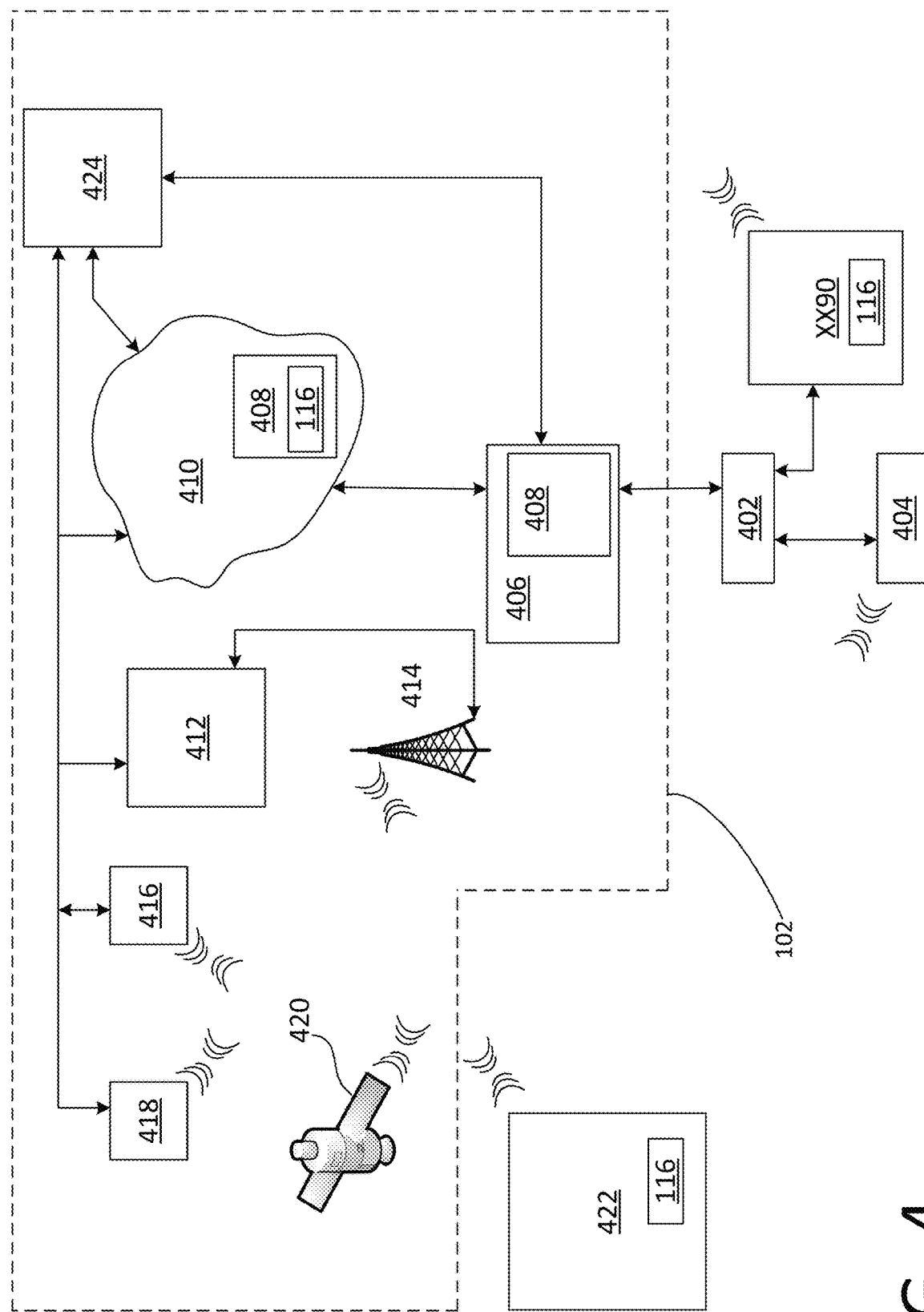
FIG. 4 illustrates a network system within which the system and method for optimizing equalization settings for the specific type of audio on a computer can be implemented according to aspects of the embodiments.

FIG. 4 illustrates network 102 within which the system and method for optimizing equalization settings for the specific type of audio, according to aspects of the embodiments. Much of the infrastructure of network 102 shown in FIG. 4 is or should be known to those of skill in the art, so, in fulfillment of the dual purposes of clarity and brevity, a detailed discussion thereof shall be omitted.

According to aspects of the embodiments, a user of the above described system and method can store App 116 on their computer 390 as well as mobile electronic device (MED)/personal electronic device (PED) 422 (hereon in referred to as "PEDs 422). PEDs 422 can include, but are not limited to, so-called smart phones, tablets, personal digital assistants (PDAs), notebook and laptop computers, and essentially any device that can access the internet and/or cellular phone service or can facilitate transfer of the same type of data in either a wired or wireless manner.

PED 422 can access cellular service provider 412, either through a wireless connection (cell tower 414) or via a wireless/wired interconnection (a "Wi-Fi" system that comprises, e.g., modulator/demodulator (modem) 402, wireless router 404, internet service provider (ISP) 406, and internet 410 (although not shown, those of skill in the art can appreciate that internet 410 comprises various different types of communications cables, servers/routers/switches 408, and the like, wherein data/software/applications of all types is stored in memory within or attached to servers or other processor based electronic devices, including, for example, App 116 within a computer/server that can be accessed by a user of App 116 on their PED 422 and/or computer 390). As those of skill in the art can further appreciate, internet 410 can include access to "cloud" computing service(s) and devices, wherein the cloud refers to the on-demand availability of computer system resources, especially data storage and computing power, without direct active management by the user. Large clouds often have functions distributed over multiple locations, each location being a data center.

Further, PED 422 can include NFC, "Wi-Fi," and Bluetooth (BT) communications capabilities as well, all of which are known to those of skill in the art. To that end, network 102 further includes, as many homes (and businesses) do, one or more computers 390 that can be connected to wireless router 404 via a wired connection (e.g., modem 402) or via a wireless connection (e.g., Bluetooth). Modem 402 can be connected to ISP 406 to provide internet-based communications in the appropriate format to end users (e.g., computer 390), and which takes signals from the end users and forwards them to ISP 406.

PEDs 422 can also access global positioning system (GPS) satellite 420, which is controlled by GPS station 418, to obtain positioning information (which can be useful for different aspects of the embodiments), or PEDs 422 can obtain positioning information via cellular service provider 412 using cellular tower(s) (cell tower) 414 according to one or more methods of position determination. Some PEDs 422 can also access communication satellites 420 and their respective satellite communication systems control stations 416 (the satellite in FIG. 4 is shown common to both communications and GPS functions) for near-universal communications capabilities, albeit at a much higher cost than convention "terrestrial" cellular services. PEDs 422 can also obtain positioning information when near or internal to a building (or arena/stadium) through the use of one or more of NFC/BT devices. FIG. 4 also illustrates other components of network 102 such as plain old telephone service (POTS) provider 424.

According to further aspects of the embodiments, and as described above, network 102 also contains other types of servers/devices that can include computer 390, wherein one or more processors, using currently available technology, such as memory, data and instruction buses, and other electronic devices, can store and implement code that can implement the system and method for optimizing equalization settings for the specific type of audio, according to aspects of the embodiments.

According to further aspects of the embodiments, additional features and functions of inventive embodiments are described herein below, wherein such descriptions are to be viewed in light of the above noted detailed embodiments as understood by those skilled in the art.

According to further aspects of the embodiments, additional features and functions of inventive embodiments are described herein below, wherein such descriptions are to be viewed in light of the above noted detailed embodiments as understood by those skilled in the art.

As described above, an encoding process is discussed specifically in reference to FIGS. 2, although such delineation is not meant to be, and should not be taken in a limiting manner, as additional methods according to aspects of the embodiments have been described herein. The encoding processes as described are not meant to limit the aspects of the embodiments, or to suggest that the aspects of the embodiments should be implemented following the encoding processes. The purpose of the encoding processes as described is to facilitate the understanding of one or more aspects of the embodiments and to provide the reader with one or many possible implementations of the processed discussed herein. FIG. 2 illustrates a flowchart of various steps performed during the encoding process, but such encoding processes are not limited thereto. The steps of FIG. 2 are not intended to completely describe the encoding processes but only to illustrate some of the aspects discussed above.

This application may contain material that is subject to copyright, mask work, and/or other intellectual property protection. The respective owners of such intellectual property have no objection to the facsimile reproduction of the disclosure by anyone as it appears in published Patent Office file/records, but otherwise reserve all rights.

It should be understood that this description is not intended to limit the embodiments. On the contrary, the embodiments are intended to cover alternatives, modifications, and equivalents, which are included in the spirit and scope of the embodiments as defined by the appended claims. Further, in the detailed description of the embodiments, numerous specific details are set forth to provide a comprehensive understanding of the claimed embodiments. However, one skilled in the art would understand that various embodiments may be practiced without such specific details.

Although the features and elements of aspects of the embodiments are described being in particular combinations, each feature or element can be used alone, without the other features and elements of the embodiments, or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

The above-described embodiments are intended to be illustrative in all respects, rather than restrictive, of the embodiments. Thus, the embodiments are capable of many variations in detailed implementation that can be derived from the description contained herein by a person skilled in the art. No element, act, or instruction used in the description of the present application should be construed as critical or essential to the embodiments unless explicitly described as such. Also, as used herein, the article "a" is intended to include one or more items.

All United States patents and applications, foreign patents, and publications discussed above are hereby incorporated herein by reference in their entireties.

INDUSTRIAL APPLICABILITY

To solve the aforementioned problems, the aspects of the embodiments are directed towards systems, methods, and modes to automatically change and optimize equalization settings for an audio source based on the type of audio being broadcast.

ALTERNATE EMBODIMENTS

Alternate embodiments may be devised without departing from the spirit or the scope of the different aspects of the embodiments.

What is claimed is:

1. A method for optimizing audio equalization settings based on the type of music being broadcast, comprising:
receiving audio at a processing device;
performing a frequency analysis of the received audio, to determine a plurality of frequency components and associated amplitudes of the frequency components of the received audio;
generating a spectral plot of the received audio based on the performed frequency analysis of the received audio, wherein the spectral plot comprises a Y axis that represents relative amplitude and an X axis that represents frequency components of the received audio;
comparing the spectral plot of the received audio to each of a plurality of different predetermined spectral plots;
matching the spectral plot of the received audio to at least one of a plurality of different predetermined spectral plots;
retrieving a predetermined equalizer settings file that corresponds to the at least one of the matched predetermined spectral plots, wherein the predetermined equalizer settings file comprises a plurality of relative amplitude settings for each of a plurality of frequency bands; and applying the retrieved predetermined equalizer settings to an equalizer that processes the received audio according to the predetermined equalizer settings in the predetermined equalizer settings file, and wherein the step of matching comprises:

comparing amplitudes of the received audio to predetermined spectral plots that represent known genres of audio at a predetermined set of frequency values, and further wherein the predetermined set of frequency values are selected based on their relative amplitudes, such that the more dominant amplitude values in a genre are used to perform the matching.

2. The method according to claim 1, wherein the predetermined set of frequency values comprises:
a set of frequency values that are substantially continuous from about 20 Hz to about 20 kHz.

3. The method according to claim 1, wherein the predetermined set of frequency values comprises:
a substantially uniform but not continuous set of frequency values between about 20 Hz to about 20 kHz.

4. The method according to claim 1, wherein the predetermined set of frequency values comprises:
a substantially non-uniform and not continuous set of frequency values between about 20 Hz to about 20 kHz.

5. An audio distribution system, comprising:
at least one audio receiver, wherein the at least one audio receiver comprises:
at least one processor;
a memory operatively connected with the at least one processor, wherein the memory stores computer-executable instructions that, when executed by the at least one processor, causes the at least one processor to execute a method that comprises:
receiving audio at a processing device;
performing a frequency analysis of the received audio, to determine a plurality of frequency components and associated amplitudes of the frequency components of the received audio;
generating a spectral plot of the received audio based on the performed frequency analysis of the received audio, wherein the spectral plot comprises a Y axis that represents relative amplitude and an X axis that represents frequency components of the received audio;
comparing the spectral plot of the received audio to each of a plurality of different predetermined spectral plots;
matching the spectral plot of the received audio to at least one of a plurality of different predetermined spectral plots;
retrieving a predetermined equalizer settings file that corresponds to the at least one of the matched predetermined spectral plots, wherein the predetermined equalizer settings file comprises a plurality of relative amplitude settings for each of a plurality of frequency bands; and
applying the retrieved predetermined equalizer settings to an equalizer that processes the received audio according to the predetermined equalizer settings in the predetermined equalizer settings file, and wherein the step of matching comprises:
comparing amplitudes of the received audio to predetermined spectral plots that represent known genres of audio at a predetermined set of frequency values, and further wherein
the predetermined set of frequency values are selected based on their relative amplitudes, such that the more dominant amplitude values in a genre are used to perform the matching.

6. The system according to claim 5, wherein the predetermined set of frequency values comprises:
a set of frequency values that are substantially continuous from about 20 Hz to about 20 kHz.

7. The system according to claim 5, wherein the predetermined set of frequency values comprises:
a substantially uniform but not continuous set of frequency values between about 20 Hz to about 20 kHz.

8. The system according to claim 5, wherein the predetermined set of frequency values comprises:
a substantially non-uniform and not continuous set of frequency values between about 20 Hz to about 20 kHz.

* * * * *